US008927114B2

(12) United States Patent
Nomura et al.

(10) Patent No.: US 8,927,114 B2
(45) Date of Patent: Jan. 6, 2015

(54) LIGHT EMITTING ELEMENT AND ELECTRONIC DEVICE USING THE SAME

(75) Inventors: Ryoji Nomura, Kanagawa (JP); Satoshi Seo, Kanagawa (JP); Hiroko Abe, Tokyo (JP); Takako Takasu, Kanagawa (JP); Hideko Inoue, Kanagawa (JP); Hisao Ikeda, Kanagawa (JP); Daisuke Kumaki, Niigata (JP); Junichiro Sakata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1237 days.

(21) Appl. No.: 10/575,120

(22) PCT Filed: Nov. 24, 2005

(86) PCT No.: PCT/JP2005/022039
§ 371 (c)(1),
(2), (4) Date: Apr. 7, 2006

(87) PCT Pub. No.: WO2006/059665
PCT Pub. Date: Jun. 8, 2006

(65) Prior Publication Data
US 2009/0140634 A1 Jun. 4, 2009

(30) Foreign Application Priority Data
Nov. 30, 2004 (JP) ................ 2004-347693

(51) Int. Cl.
*H01L 51/54* (2006.01)
*H01L 51/50* (2006.01)
*H01L 51/00* (2006.01)

(52) U.S. Cl.
CPC ........ *H01L 51/5052* (2013.01); *H01L 51/5016* (2013.01); *H01L 51/0062* (2013.01);
(Continued)

(58) Field of Classification Search
USPC .............. 428/690, 917; 313/504, 505, 506; 257/40, E51.05, E51.026, E51.032; 548/304.4, 418, 440
See application file for complete search history.

(56) References Cited

U.S. PATENT DOCUMENTS 5,198,153 A * 3/1993 Angelopoulos et al. ...... 252/500
6,423,429 B2 7/2002 Kido et al.
(Continued)

FOREIGN PATENT DOCUMENTS

EP 0 948 063 A2 10/1999
EP 1 351 558 A1 10/2003
(Continued)

OTHER PUBLICATIONS

Tokito et al., Journal of Physics: Applied Physics, (1996), vol. 29, pp. 2750-2753.*
(Continued)

*Primary Examiner* — Gregory Clark
(74) *Attorney, Agent, or Firm* — Husch Blackwell LLP

(57) ABSTRACT

A layer included in an electroluminescent element is required to be thickened to optimize light extraction efficiency of the electroluminescent element and to prevent short-circuit between electrodes. However, in a conventional element material, desired light extraction efficiency cannot be accomplished since drive voltage rises or power consumption is increased as the element material is thickened. A composite is formed by mixing a conjugated molecule having low ionization potential and a substance having an electron-accepting property to the conjugated molecule. A composite layer included in an element is formed using the composite as an element material. The composite layer is arranged between a first electrode and a light emitting layer or between a second electrode and a light emitting layer. The composite layer has high conductivity; therefore, drive voltage does not rise even if a film thickness is increased. Thus, an electroluminescent element which can prevent short-circuit of an electrode can be provided.

9 Claims, 14 Drawing Sheets

(52) U.S. Cl.
CPC .......... *H01L 51/0094* (2013.01); *Y10S 428/917* (2013.01)
USPC .......... 428/690; 428/917; 313/504; 313/505; 313/506; 257/40; 257/E51.05; 257/E51.026; 257/E51.032; 548/304.1; 548/418; 548/440

(56) References Cited

U.S. PATENT DOCUMENTS

| | | | |
|---|---|---|---|
| 7,059,928 | B2 | 6/2006 | Ikeda |
| 7,192,535 | B2 | 3/2007 | Takasu et al. |
| 7,416,464 | B2 | 8/2008 | Ikeda |
| 7,646,010 | B2 | 1/2010 | Kawakami et al. |
| 8,080,934 | B2 | 12/2011 | Kido et al. |
| 8,101,857 | B2 | 1/2012 | Kido et al. |
| 2002/0180349 | A1* | 12/2002 | Aziz et al. ............ 313/506 |
| 2003/0189401 | A1* | 10/2003 | Kido et al. ............ 313/504 |
| 2004/0018382 | A1* | 1/2004 | Kinlen .................. 428/690 |
| 2004/0067387 | A1* | 4/2004 | Kim et al. ............. 428/690 |
| 2004/0119049 | A1 | 6/2004 | Heeney et al. ........ 252/299.3 |
| 2004/0131883 | A1 | 7/2004 | Luh et al. ............. 428/690 |
| 2004/0241494 | A1 | 12/2004 | Takasu et al. ........ 428/690 |
| 2004/0258954 | A1* | 12/2004 | Takasu et al. ........ 428/690 |
| 2006/0008672 | A1* | 1/2006 | Jarikov ................. 428/690 |
| 2006/0131570 | A1* | 6/2006 | Meng .................... 257/40 |
| 2007/0114512 | A1 | 5/2007 | Kumaki et al. |
| 2007/0114527 | A1 | 5/2007 | Kumaki et al. |
| 2007/0200125 | A1 | 8/2007 | Ikeda et al. |
| 2012/0118350 | A1 | 5/2012 | Kido et al. |
| 2012/0132895 | A1 | 5/2012 | Kido et al. |

FOREIGN PATENT DOCUMENTS

| | | | |
|---|---|---|---|
| EP | 1 439 590 A2 | 7/2004 | |
| EP | 1439590 A2 * | 7/2004 | ............ H01L 51/30 |
| EP | 1 580 209 A1 | 9/2005 | |
| EP | 1 617 493 A2 | 1/2006 | |
| JP | 11-251067 | 9/1999 | |
| JP | 2000-306669 | 11/2000 | |
| JP | 2001-123157 | 5/2001 | |
| JP | 2003-272860 | 9/2003 | |
| JP | 2004-075685 | 3/2004 | |
| JP | 2004-186695 | 7/2004 | |
| JP | 2004-327166 | 11/2004 | |
| JP | 2004-335415 | 11/2004 | |
| JP | 2006-24791 | 1/2006 | |
| WO | WO 2004/058850 A1 | 7/2004 | |
| WO | WO 2004/064453 A1 | 7/2004 | |
| WO | WO 2005/031798 | 4/2005 | |
| WO | WO 2005/064995 A1 | 7/2005 | |
| WO | WO 2006/009262 A1 | 1/2006 | |

OTHER PUBLICATIONS

Liu et al., Applied Physics Letters, (2007), vol. 91, 142106.*
International Search Report re application No. PCT/JP2005/022039, dated Feb. 7, 2006.
Written Opinion re application No. PCT/JP2005/022039, dated Feb. 7, 2006.

* cited by examiner

LIGHT EMITTING ELEMENT AND ELECTRONIC DEVICE USING THE SAME

TECHNICAL FIELD

The present invention relates to a light emitting element. More specifically, the invention relates to a light emitting element having a layer composed of a composite of a conjugated molecule and a substance having an electron-accepting property to the conjugated molecule. Further, the invention relates to a light emitting device including a light emitting element.

BACKGROUND ART

An electroluminescent (EL) display is one of the most remarkable devices as a flat panel display device for the next generation, which is composed of a light emitting element. In a light emitting element, electrons injected from a cathode and holes injected from an anode are recombined in a light emitting layer when current is flowed to form molecule excitons. The light emitting element emits light by using photons discharged when the molecular excitons return to the ground state. Therefore, one of conditions to manufacture a light emitting element having favorable emission efficiency is to use whole excitation energy of molecule excitons for light emission.

One example which meets the above condition is a multilayer structure of a light emitting element. For example, a multilayer is formed of a hole injecting layer, a hole transport layer, a light emitting layer, an electron transport layer, an electron injecting layer, and the like between a pair of electrodes including an anode and a cathode.

Further, the effective injection of holes and electrons, which are carriers, to a light emitting layer is also one of the conditions to manufacture a light emitting element having favorable emission efficiency. For that purpose, it is conventional and known that a material having low ionization potential is used for a hole injecting layer and a material having high electron affinity is used for an electron injecting layer.

Such a layer included in a multilayer structure of a light emitting element described above is formed from metal oxide which is an inorganic compound, or an organic compound.

In addition, an attempt to form a light emitting element using a layer in which an organic compound is mixed with an inorganic compound has been made. For example, a light emitting element formed by stacking a layer formed from a material dispersed with an organic compound (a hole transporting compound, an electron transporting compound, and a luminescent compound) in a silica matrix via a covalent bond is disclosed in the following Patent Document 1 (Patent Document 1: Japanese Patent Application Laid-Open No. 2000-306669). In the Patent Document 1, it is reported that durability or heat-resistance of an element is enhanced.

DISCLOSURE OF INVENTION

However, there is the following problem in the case of using metal oxide as a layer included in a light emitting element. Metal oxide is easy to crystallize, and by the crystallization, depression/projection is formed in the surface of the metal oxide. An electric field is concentrated in this projection and therefore a light emitting element having high reliability cannot be obtained. In addition, there is another problem that drive voltage rises when a film thickness of metal oxide is increased for the purpose of preventing short-circuit between electrodes of a light emitting element due to dust or the like or for the purpose of optical design that light from a light emitting layer is efficiently extracted.

On the other hand, in the case of using an organic compound as a layer included in a light emitting element, drive voltage rises since holes are difficult to go into the organic compound if a material having a low work function is used as an anode. Therefore, it is not preferable to use a material having a low work function as an anode, so there is a limitation on an anode material. In addition, there is another problem that drive voltage rises when a film thickness is increased in a similar way to the above metal oxide material.

Further, in a light emitting element disclosed in the above Patent Document 1, organic compounds are simply dispersed in metal oxide having an insulating property; therefore, current is made to be difficult to flow compared with a conventional light emitting element (in other words, voltage which is required to flow a certain amount of current is increased). That is, only current having low density flows. Therefore, in the structure disclosed in the Patent Document 1, drive voltage rises or power consumption is increased even though durability or heat-resistance is obtained.

In addition, when a film thickness is increased in the structure shown in the Patent Document 1, the rising of drive voltage is made to be further apparent. That is, it is practically difficult to increase a film thickness in the structure disclosed in the Patent Document 1.

FIG. 14 is a conventional light emitting element disclosed in the above Patent Document 1, in which a layer 1503 formed from a material dispersed with an organic compound in a silica matrix is interposed between a first electrode (anode) 1501 and a second electrode (cathode) 1502. That is, although the layer 1503 is entirely formed from a silica matrix, reference numeral 1511 denotes a hole transport layer formed from a material dispersed with a hole transporting compound in a silica matrix, reference numeral 1513 denotes an electron transport layer formed from a material dispersed with an electron transporting compound in a silica matrix, and reference numeral 1512 denotes a light emitting layer formed from a material dispersed with a luminescent compound in a silica matrix. It is considered that, when voltage is applied to this element, holes and electrons are injected from the first electrode (anode) 1501 and the second electrode (cathode) 1502, respectively, and then recombined with each other in the light emitting layer 1512, thereby the luminescent compound emits light.

Although carrier transport in this element is conducted by the hole transport layer 1511 or the electron transport layer 1513, there is a problem that current is difficult to flow since an organic compound is dispersed in an insulating silica matrix. For example, in the hole transport layer 1511, a hole moves by hopping among hole transporting compounds existing in the hole transport layer 1511; therefore, a silica matrix having an insulating property is uninvolved in hole transporting. On the contrary, the silica matrix prevents a hole from hopping. This is applicable to the electron transport layer 1513. Therefore, drive voltage obviously rises compared with a conventional light emitting element.

It is an object of the invention to provide a light emitting element which operates at low drive voltage. It is another object of the invention to provide a light emitting element having high reliability. It is still another object of the invention to provide a light emitting element which can easily prevent short-circuit between electrodes. It is still more another object of the invention to provide a light emitting element having high light extraction efficiency. It is still further more another object of the invention to provide a light emitting element having a high hole injecting property or a high hole transporting property.

As a result of diligent study, the inventors have finally found out that the object can be achieved by arranging a layer (hereinafter, referred to as composite layer) composed of a composite of any of conjugated molecules represented by general formulas [1] to [5] (hereinafter, referred to as conjugated molecule) and a substance having an electron-accepting property to this conjugated molecule (hereinafter, referred to as electron-accepting substance) between at least one of a pair of electrodes and a light emitting layer placed between the pair of electrodes.

It is preferable to use metal oxide or metal nitride as the electron-accepting substance, more preferably, oxide having a transition metal which belongs to any one of Groups 4 to 12 in the periodic table. Of the transition metal oxides, many oxides each having a transition metal which belongs to any one of Groups 4 to 8 have high electron-accepting properties. In particular, vanadium oxide, molybdenum oxide, rhenium oxide, tungsten oxide, ruthenium oxide, titanium oxide, chromium oxide, zirconium oxide, hafnium oxide, tantalum oxide, and niobium oxide are preferred.

Further, an organic compound having an electron-accepting property may be used as the electron-accepting substance. Specifically, 7,7,8,8-tetracyano-2,3,5,6-tetrafluoroquinodimethan (F4-TCNQ), chloranil, and the like are given. Further, Lewis acid may be used as the electron-accepting substance. As an example of Lewis acid, $FeCl_3$ (iron chloride (III)) and $AlCl_3$ (aluminum chloride) are given.

The most suitable mixture ratio of the electron-accepting substance in the composite layer to any of the conjugated molecules represented by general formulas [1] to [5] is as follows: an electron-accepting substance/conjugated molecule=0.1 to 10, preferably 0.5 to 2, at a molar ratio. At this mixture ratio, an electron is efficiently transferred between the electron-accepting substance and the conjugated molecule and the highest conductivity of the composite layer is obtained.

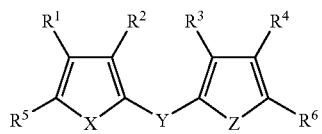

[1]

wherein X is the same as or different from Z, and X and Z each represent any of a sulfur atom, an oxygen atom, a nitrogen atom to which hydrogen, an alkyl group, or an aryl group is bonded, or a silicon atom to which hydrogen, alkyl group, or an aryl group is bonded; Y represents an arylene group; and $R^1$ to $R^6$ each represent any of hydrogen, an aryl group, an alkyl group, a cyano group, a dialkylamino group, a thioalkoxy group, and an alkoxy group.

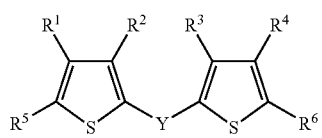

[2]

wherein Y represents an arylene group, and $R^1$ to $R^6$ each represent any of hydrogen, an aryl group, an alkyl group, a cyano group, a dialkylamino group, a thioalkoxy group, and an alkoxy group.

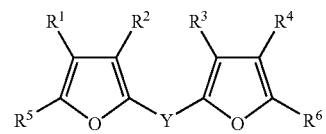

[3]

wherein Y represents an arylene group, and $R^1$ to $R^6$ each represent any of hydrogen, an aryl group, an alkyl group, a cyano group, a dialkylamino group, a thioalkoxy group, and an alkoxy group.

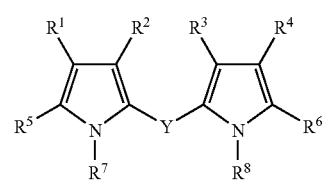

[4]

wherein Y represents an arylene group; $R^1$ to $R^6$ each represent any of hydrogen, an aryl group, an alkyl group, a cyano group, a dialkylamino group, a thioalkoxy group, and an alkoxy group; and $R^7$ and $R^8$ each represent any of hydrogen, an alkyl group, and an aryl group.

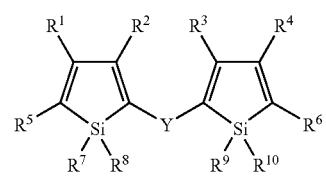

[5]

wherein Y represents an arylene group; $R^1$ to $R^6$ each represent any of hydrogen, an aryl group, an alkyl group, a cyano group, a dialkylamino group, a thioalkoxy group, and an alkoxy group; and $R^7$ to $R^{10}$ each represent any of hydrogen, an alkyl group, and an aryl group.

As for the conjugated molecules represented by the above general formulas [1] to [5], in the formula, Y represents an arylene group and represents a bivalent aromatic hydrocarbon radical having a carbon number of 6 to 20 or a bivalent heteroaromatic ring radical having a carbon number of 4 to 30 including oxygen, nitrogen, sulfur, or silicon.

As for the conjugated molecules represented by the above general formulas [1] to [5], in the formula, a cyclic structure is formed by $R^1$ and $R^2$ and a cyclic structure is formed by $R^3$ and $R^4$.

One embodiment of the invention comprises a pair of electrodes formed of a first electrode and a second electrode; a light emitting layer between the electrodes; a first layer between the first electrode and the light emitting layer; and a second layer between the second electrode and the light emitting layer, wherein the first layer or the second layer includes a composite layer of an electron-accepting substance and any of the conjugated molecules represented by general formulas [1] to [5].

In the above embodiment, the composite layer may be arranged so as to be in contact with the first electrode or may be arranged so as to be in contact with the light emitting layer in the first layer. The composite layer may be arranged so as to be in contact with the second electrode or may be arranged so as to be in contact with the light emitting layer in the second layer.

In the above embodiment, both of the first layer and the second layer may include the composite layer. In a light emitting element in which light is emitted from the light emitting layer when voltage is applied to the electrode so that an electric potential of the first electrode is higher than an electric potential of the second electrode, an electron generation layer is provided at a light emitting layer side so as to be in contact with the composite layer in the case where the composite layer is included in the second layer.

The term "composite layer" in this specification means a layer formed by using a composite of any of conjugated molecules represented by general formulas [1] to [5] described above and a substance having an electron-accepting property to the conjugated molecule.

The conjugated molecules represented by the general formulas [1] to [5] is obtainable by introducing any two skeletons of a thiophene skeleton, a furan skeleton, a pyrrol skeleton, and a silole skeleton which are electron abundant aromatic rings having low ionization potential into a conjugated molecule such as a phenylene ring. The conjugated molecule is expected to have low ionization potential. In particular, when $R^1$ to $R^6$ are substituents having an electron-donating property such as an alkoxy group, it is possible to provide a conjugated molecule having further smaller ionization potential. By mixing such a conjugated molecule with an electron-accepting substance, a composite layer is obtained, and accordingly, an electron is transferred between the conjugated molecule and the electron-accepting substance. In other words, a hole based on ionization potential of a conjugated molecule is already generated in the composite layer before voltage is applied to a light emitting element.

Therefore, a light emitting element with lower hole injection barrier can be obtained by including a composite layer of the present application compared with a layer formed from only a material having low ionization potential. Further, a light emitting element in which a hole is easy to move can be obtained. In terms of such a function of the composite layer, the composite layer of the present application has a function like a hole generation layer or a hole transport layer in some cases.

Further, as described above, an electron is transferred even before voltage is applied in the composite layer employed in the present application; therefore, the composite layer is a film having extremely high conductivity. Thus, a light emitting element in which drive voltage and power consumption are low can be provided. In addition, drive voltage scarcely rises in proportion to the thickening of the composite layer; therefore, short-circuit between electrodes of a light emitting element can be prevented by thickening the composite layer. Further, light extraction efficiency can be optimized by thickening the composite layer. Furthermore, a light emitting element having high reliability can be provided. In addition, a light emitting element having high emission efficiency can be provided.

The composite layer in which a conjugated molecule is mixed with an electron-accepting substance is difficult to be crystallized; therefore, a light emitting element with less operation failure due to crystallization of a layer can be obtained.

BRIEF DESCRIPTION OF DRAWINGS

In the accompanying drawings.

BEST MODE FOR CARRYING OUT THE INVENTION

Hereinafter, embodiments according to the present invention are described in detail with reference to the drawings. However, it is easily understood by those who are skilled in the art that embodiments and details herein disclosed can be modified in various ways without departing from the purpose and the scope of the present invention. Therefore, it should be noted that the description of embodiments should not be interpreted as limiting the present invention. Further, any of the embodiments and examples to be given below can be appropriately combined.

Embodiment 1

One mode of a light emitting element of the present invention is explained with reference to FIGS. 1A to 1C.

Figure 1A:
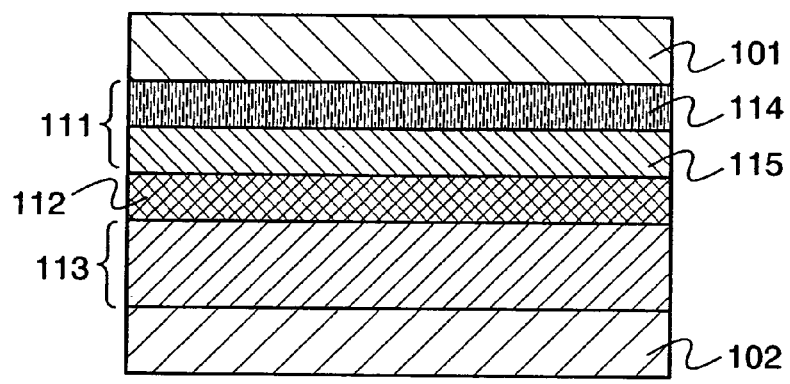
FIGS. 1A to 1C are views showing a light emitting element according to the present invention.
Figure 1B:
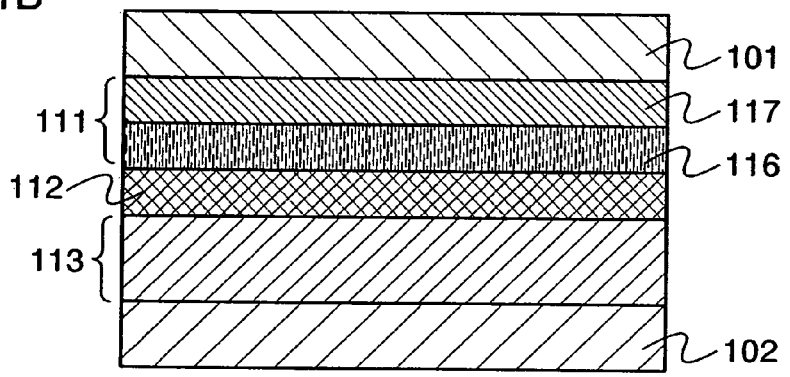
Figure 1C:
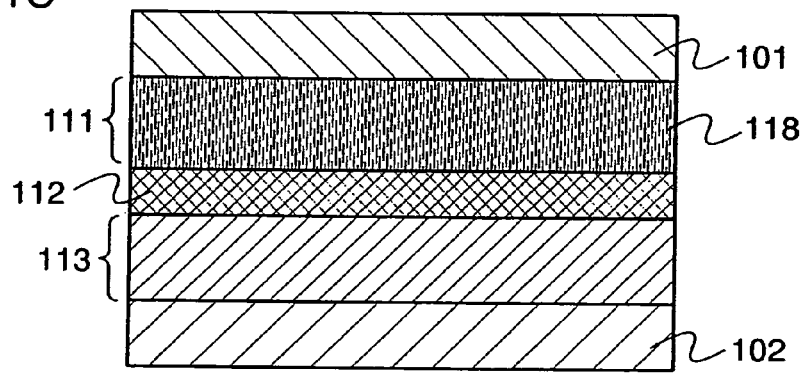

FIGS. 1A to 1C show a light emitting element including a first layer 111 which is in contact with a first electrode 101, a second layer 112 which is in contact with the first layer 111, and a third layer 113 which is in contact with the second layer 112 and a second electrode 102 between the first electrode 101 and the second electrode 102. In FIGS. 1A to 1C, light is emitted when voltage is applied to the electrode so that an electric potential of the first electrode 101 is higher than an electric potential of the second electrode 102. The second layer 112 is a light emitting layer, and the third layer 113 is a layer having a function of transporting or injecting an electron to the light emitting layer which is the second layer.

The second layer 112 contains a light emitting substance. The second layer 112 may be a layer formed from only a light emitting substance. However, in the case of generating concentration quenching, the second layer 112 is preferably formed by dispersing a light emitting substance into a layer formed from a substance having a larger energy gap than the energy gap of the light emitting substance. By including a light emitting substance in the second layer 112 by dispersing, light emission can be prevented from quenching due to concentration. Here, the term "energy gap" means an energy gap between the LUMO level and the HOMO level.

The light emitting substance is not especially limited, and a substance capable of emitting light with a desired emission wavelength and having favorable emission efficiency may be used. In order to obtain red light emission, for example, the following substances exhibiting emission spectrum with peaks at 600 nm to 680 nm can be employed as the light emitting substance: 4-dicyanomethylene-2-isopropyl-6-[2-(1,1,7,7-tetramethyljulolidine-9-yl)ethenyl]-4H-pyran (abbreviated as DCJTI); 4-dicyanomethylene-2-methyl-6-[2-(1, 1,7,7-tetramethyljulolidine-9-yl)ethenyl]-4H-pyran (abbreviated as DCJT); 4-dicyanomethylene-2-tert-butyl-6-[2-(1,1,7,7-tetramethyljulolidine-9-yl)ethenyl]-4H-pyran (abbreviated as DCJTB); periflanthene; 2,5-dicyano-1,4-bis [2-(10-methoxy-1,1,7,7-tetramethyljulolidine-9-yl)ethenyl] benzene; or the like. In order to obtain green light emission, substances exhibiting emission spectrum with peaks at 500 nm to 550 nm such as N,N'-dimethylquinacridon (abbreviated as DMQd); coumarin 6; coumarin 545T; or tris(8-quinolinolato) aluminum (abbreviated as $Alq_3$) can be employed as the light emitting substance. In order to obtain blue light emission, the following substances exhibiting emission spectrum with peaks at 420 nm to 500 nm can be employed as the light emitting substance: 9,10-bis(2-naphthyl)-tert-butylanthracene (abbreviated as t-BuDNA); 9,9'-bianthryl; 9,10-diphenylanthracene (abbreviated as DPA); 9,10-bis(2-naphthyl) anthracene (abbreviated as DNA); bis(2-methyl-8-quinolinolato)-4-phenylphenolate-gallium (abbreviated as BGaq); bis(2-methyl-8-quinolinolato)-4-phenylphenolate-aluminum (abbreviated as BAlq); or the like. As described above, in addition to such substances which emit fluorescence, substances which emit phosphorescence such as bis [2-(3,5-bis(trifluoromethyl)phenyl)pyridinato-N,$C^{2'}$]iridium (III) picolinato (abbreviated as $Ir(CF_3ppy)_2(pic)$); bis[2-(4,6-difluorophenyl)pyridinato)-N,$C^{2'}$]iridium(III) acetylacetonato (abbreviated as FIr(acac)); bis[2-(4,6-difluorophenyl)pyridinato-N,$C^{2'}$]iridium(III)picolinato (abbreviated as FIr(pic)); or tris(2-phenylpyridinato-N,$C^{2'}$) iridium (abbreviated as $Ir(ppy)_3$) can also be used as the light emitting substance.

Further, a substance included in the light emitting layer as well as the light emitting substance and used in order that the light emitting substance is dispersed is not especially limited, and may be appropriately selected by taking into consideration that an energy gap or the like of a substance used as the light emitting substance. For example, an anthracene derivative such as 9,10-di(2-naphthyl)-2-tert-butylanthracene (abbreviated as t-BuDNA); a carbazole derivative such as 4,4'-bis(N-carbazolyl)biphenyl (abbreviated as CBP); a quinoxaline derivative such as 2,3-bis(4-diphenylaminophenyl) quinoxaline (abbreviated as TPAQn) or 2,3-bis{4-[N-(1-naphthyl)-N-phenylamino]phenyl}-dibenzo[f,h]quinoxaline (abbreviated as NPADiBzQn); a metal complex such as bis [2-(2-hydroxyphenyl)pyridinato]zinc (abbreviated as $Znpp_2$) or bis[2-(2-hydroxyphenyl)benzoxazolato]zinc (abbreviated as ZnBOX); and the like can be used together with the light emitting substance.

In FIG. 1A, the first layer 111 includes a composite layer 114 composed of a composite formed from a conjugated molecule and an electron-accepting substance, and a hole transport layer 115. The composite layer 114 is arranged at a first electrode 101 side in the first layer, and the hole transport layer 115 is arranged at a second layer 112 side. In this structure, the composite layer 114 serves as a hole generation layer.

In general, an electrode material having a high work function is used as the first electrode 101; however, an electrode having a low work function (for example, aluminum, magnesium, and the like) can be used as the first electrode 101 when the composite layer 114 is in contact with the first electrode 101. This is because a hole is transferred also between the first electrode 101 having a low work function and the composite layer 114 since ionization potential of a conjugated molecule, which is a configuration factor of the composite layer 114, is extremely low and a hole is generated in the composite layer 114.

In FIG. 1B, the first layer 111 includes a composite layer 116 composed of a composite formed from a conjugated molecule and an electron-accepting substance, and a hole injecting layer 117. The composite layer 116 is arranged at a second layer side in the first layer, and the hole injecting layer 117 is arranged at a first electrode 101 side. In this structure, the composite layer 116 serves as a hole transport layer.

In FIG. 1C, the first layer 111 is a composite layer 118 composed of a composite formed from a conjugated molecule and an electron-accepting substance. In this structure, the composite-layer 118 serves as a hole generation layer or a hole transport layer, or both of a hole generation layer and a hole transport layer.

Since the composite layer is placed between the first electrode 101 and the second layer 112 which is a light emitting layer in any of structures of FIGS. 1A to 1C, a light emitting element having a high hole injecting property or a high hole transporting property can be obtained. Further, a drive voltage does not rise even if a film thickness of the composite layer is made to be increased since the composite layer has high conductivity. Therefore, light extraction efficiency can be optimized or short-circuit between the electrodes of the light emitting element can be suppressed by thickening the composite layer. Although an example in which the composite layer is in contact with the first electrode or the second electrode is shown in each of FIGS. 1A and 1B, the composite layer is not necessarily in contact with the first electrode or the second electrode. Another layer may exist between the composite layer 114 and the first electrode 101 in FIG. 1A, and another layer may exist between the composite layer 116 and the second layer 112 in FIG. 1B.

In FIG. 1A, the hole transport layer 115 is a layer having a function of transporting a hole and has a function of transporting a hole from the composite layer 114 to the second layer 112. The distance between the composite layer 114 and the second layer 112 can be extended by providing the hole transport layer 115, and as a result, light emission can be prevented from quenching due to metal included in the composite layer 114. The hole transport layer is preferably formed from a substance having a high hole transporting property, and especially, the hole transport layer is preferably formed from a substance having hole mobility of $1 \times 10^{-6}$ $cm^2/Vs$ or more. It is to be noted that the term "substance having a high hole transporting property" means that mobility of a hole is higher than that of an electron and a value of a ratio of electron mobility to hole mobility (=hole mobility/electron mobility) is larger than 100. As a specific example of a substance which can be used for forming the hole transport layer 115, the following substances are given: 4,4'-bis[N-(1-naphthyl)-N-phenylamino]biphenyl (abbreviated as NPB), 4,4'-bis[N-(3-methylphenyl)-N-phenylamino]biphenyl (abbreviated as TPD), 4,4',4"-tris(N,N-diphenylamino) triphenylamine (abbreviated as TDATA), 4,4',4"-tris[N-(3-methylphenyl)-N-phenylamino]triphenylamine (abbreviated as MTDATA), 4,4'-bis{N-[4-(N,N-di-m-tolylamino)phenyl]-N-phenylamino} biphenyl (abbreviated as DNTPD), 1,3,5-tris[N,N-di(m-tolyl)amino]benzene (abbreviated as m-MTDAB), 4,4', 4"-tris(N-carbazolyl) triphenylamine (abbreviated as TCTA), phthalocyanine (abbreviated as $H_2Pc$), copper phthalocyanine (abbreviated as CuPc), vanadyl phthalocyanine (abbreviated as VOPc), and the like.

In FIG. 1B, the hole injecting layer 117 is a layer having a function of assisting the injection of a hole from the first electrode 101 to the composite layer 116. By providing the hole injecting layer 117, the difference of ionization potential between the first electrode 101 and the composite layer 116 is relieved and a hole is easy to inject. The hole injecting layer 117 is preferably formed from a substance having lower ionization potential than that of a substance from which the composite layer 116 is formed and having higher ionization potential than that of a substance from which the first electrode 101 is formed, or a substance that energy band is curved when the substance is formed as a thin film having a film thickness of 1 nm to 2 nm between the composite layer 116 and the first electrode 101. As a specific example of a substance which can be used for forming the hole injecting layer 117, a phthalocyanine-based compound such as phthalocyanine (abbreviated as $H_2Pc$) or copper phthalocyanine (CuPC); a high molecular weight material such as poly(ethylenedioxythiophene)/poly(styrene sulfonate) water solution (PEDOT/PSS); and the like are given. The hole injecting layer 117 is preferably formed so that ionization potential in the hole injecting layer 117 is comparatively higher than ionization potential in the composite layer 116. In the case of providing the hole injecting layer 117, the first electrode 101 is preferably formed from a substance having a high work function such as indium tin oxide.

The third layer 113 may be a layer having a function of transporting or injecting an electron injected from the second electrode 102 to a light emitting layer which is the second layer, and the structure is not limited. In the case where the third layer 113 includes, for example, an electron transport layer, any layer may be generally used for the electron transport layer as long as the electron transport layer has a function of transporting an electron. As a material for forming the electron transport layer, the following substances are given: metal complexes such as tris(8-quinolinolato) aluminum (abbreviated as $Alq_3$), tris(4-methyl-8-quinolinolato) aluminum (abbreviated as $Almq_3$), bis(10-hydroxybenzo[h]-quinolinato) beryllium (abbreviated as $BeBq_2$), bis(2-methyl-8-quinolinolato)-4-phenylphenolato-aluminum (abbreviated as BAlq), bis[2-(2-hydroxyphenyl)benzoxazolato]zinc (abbreviated as $Zn(BOX)_2$), and bis[2-(2-hydroxyphenyl)benzothiazolato]zinc (abbreviated as $Zn(BTZ)_2$); 2-(4-biphenylyl)-5-(4-tert-butylphenyl)-1,3,4-oxadiazole (abbreviated as PBD); 1,3-bis[5-(p-tert-butylphenyl)-1,3,4-oxadiazole-2-yl]benzene (abbreviated as OXD-7); 3-(4-tert-butylphenyl)-4-phenyl-5-(4-biphenylyl)-1,2,4-triazole (abbreviated as TAZ); 3-(4-tert-butylphenyl)-4-(4-ethylphenyl)-5-(4-biphenylyl)-1,2,4-triazole (abbreviated as p-EtTAZ); bathophenanthroline (abbreviated as BPhen); bathocuproin (abbreviated as BCP); 4,4-bis(5-methylbenzoxazol-2-yl) stilbene (abbreviated as BzOs); and the like.

In addition, the hole transport layer 115 and the electron transport layer of the third layer 113 may be formed from a bipolar substance. A bipolar substance is a substance in which a value of a ratio of mobility of one carrier which is any of an electron and a hole to mobility of the other carrier is 100 or less, preferably 10 or less, when mobility of one carrier and mobility of the other carrier are compared with each other. As the bipolar substance, for example, 2,3-bis(4-diphenylamino phenyl) quinoxaline (abbreviated as TPAQn), 2,3-bis{4-[N-(1-naphthyl)-N-phenylamino]phenyl}-dibenzo[f,h]quinoxaline (abbreviated as NPADiBzQn), and the like are given. In particular, a substance in which mobility of a hole or an electron is $1 \times 10^{-6}$ $cm^2/Vs$ or more is preferably used among bipolar substances. Further, the hole transport layer 115 and the electron transport layer may be formed from the same bipolar substance.

In the case where the third layer 113 includes an electron generation layer, any layer may be generally used as long as the electron generation layer has a function of generating an electron. The electron generation layer can be formed by mixing at least one substance selected from a substance having a high electron transporting property or a bipolar substance with a substance which shows an electron-donating property to these substances. Here, in particular, a substance having electron mobility of $1 \times 10^{-6}$ $cm^2/Vs$ or more is preferable among a substance having a high electron transporting property and a bipolar substance. As for each of the substance having a high electron transporting property and the bipolar substance, the above-described substance can be used. At least one substance selected from alkali metal or alkaline earth metal, specifically, lithium (Li), calcium (Ca), sodium (Na), potassium (K), magnesium (Mg), or the like can be used. In addition, alkali metal oxide or alkaline earth metal oxide, alkali metal nitride, alkaline earth metal nitride, alkali metal fluoride, alkaline earth metal fluoride, or the like, specifically, lithium oxide ($Li_2O$), calcium oxide (CaO), sodium oxide ($Na_2O$), potassium oxide ($K_2O$), magnesium oxide (MgO), magnesium nitride ($Mg_3N_2$), lithium fluoride (LiF), cesium fluoride (CsF), calcium fluoride ($CaF_2$), or the like can also be used as a substance which shows an electron-donating property.

The first electrode 101 can be formed from a substance having a high work function, such as indium tin oxide, indium tin oxide containing silicon oxide, indium oxide containing zinc oxide of 2 wt % to 20 wt %, gold (Au), platinum (Pt), nickel (Ni), tungsten (W), chromium (Cr), molybdenum (Mo), iron (Fe), cobalt (Co), copper (Cu), palladium (Pd), tantalum nitride, or the like.

The second electrode 102 may be also formed from a material having a high work function, such as indium tin oxide, indium tin oxide containing silicon oxide, indium oxide containing zinc oxide of 2 wt % to 20 wt %, gold (Au), platinum (Pt), nickel (Ni), tungsten (W), chromium (Cr), molybdenum (Mo), iron (Fe), cobalt (Co), copper (Cu), palladium (Pd), tantalum nitride, or the like, or may be formed from a substance having a low work function such as aluminum or magnesium.

The light emitting element shown in this embodiment can be formed by sequentially stacking from the first electrode or the second electrode using a known film formation method. In particular, the composite layer can be formed by co-evaporating in the manner that both of a conjugated molecule and an electron-accepting substance are vaporized by resistance heating. Alternatively, the composite layer may be formed by co-evaporating in the manner that a conjugated molecule is vaporized by resistance heating and an electron-accepting substance is vaporized by electron beam (EB). Also, the following method can be given: a conjugated molecule is vaporized by resistance heating and an electron-accepting substance is sputtered, then both of them are simultaneously deposited. In addition, a dry type method may be employed.

Similarly, the first electrode 101 and the second electrode 102 can be formed by a vapor deposition method by resistance heating, EB deposition, sputtering, wet type method, or the like.

In the case of forming sequentially from the second electrode 102 and forming the first electrode 101 by sputtering, there is a problem of sputtering damage to a layer placed below the first electrode. However, the composite layer is not easily damaged by sputtering and serves as a protective film which protects a light emitting layer from sputtering damage in case of a structure shown in each of FIG. 1A and FIG. 1C since the composite layer is harder than an organic film. Accordingly, a light emitting element with fewer defects can be obtained.

Embodiment 2

This embodiment is explained with reference to FIG. 2.

Figure 2:
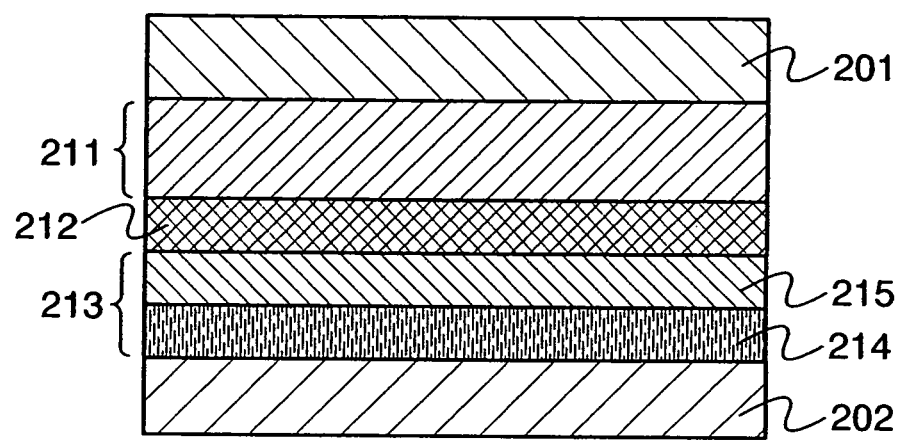
FIG. 2 is a view showing a light emitting element according to the invention.

FIG. 2 shows a light emitting element including a first layer 211 which is in contact with a first electrode 201, a second layer 212 which is in contact with the first layer 211, and a third layer 213 which is in contact with the second layer 212 and a second electrode 202 between the first electrode 201 and the second electrode 202. The light emitting element in FIG. 2 emits light when voltage is applied so that an electric potential of the first electrode 201 is higher than an electric potential of the second electrode 202. The second layer 212 is a light emitting layer and the first layer 211 is a layer having a function of transporting or injecting a hole to the light emitting layer which is the second layer. The first layer may have a hole injecting layer or a hole transport layer. A material illustrated in Embodiment 1 can be used as a light emitting material, a material for the first electrode and the second electrode, an electron transporting material, a hole transport material, and a hole injection material in this embodiment.

The third layer 213 includes a composite layer 214 at a second electrode 202 side, and an electron generation layer 215 at a second layer 212 side. A layer such as an electron transport layer may be either interposed or not between the electron generation layer 215 and the second layer 212.

The electron generation layer 215 can be formed by mixing at least one substance selected from a substance having a high electron transporting property and a bipolar substance with a substance which shows an electron-donating property to these substances. In particular, a substance having electron mobility of $1 \times 10^{-6}$ cm$^2$/Vs or more is preferable among a substance having a high electron transporting property and a bipolar substance. As for the substance having a high electron transporting property and the bipolar substance, a substance described above can be used. As a substance which shows an electron-donating property, a substance selected from alkali metal or alkaline earth metal, specifically, lithium (Li), calcium (Ca), sodium (Na), potassium (K), magnesium (Mg), or the like can be used. In addition, alkali metal oxide or alkaline earth metal oxide, alkali metal nitride, alkaline earth metal nitride, alkali metal fluoride, alkaline earth metal fluoride, or the like, specifically, lithium oxide (Li$_2$O), calcium oxide (CaO), sodium oxide (Na$_2$O), potassium oxide (K$_2$O), magnesium oxide (MgO), magnesium nitride (Mg$_3$N$_2$), lithium fluoride (LiF), cesium fluoride (CsF), calcium fluoride (CaF$_2$), or the like can also be used as a substance which shows an electron-donating property.

In accordance with the structure of this embodiment, the composite layer 214 can be disposed between the second layer 212 which is a light emitting layer and the second electrode 202. The composite layer 214 is a film having high conductivity; therefore, the composite layer can be thickened, and accordingly, short-circuit between the electrodes can be prevented and a light emitting element having high light extraction efficiency can be obtained. Further, the composite layer is difficult to be crystallized; therefore, a light emitting element having less operation failure due to crystallization of a layer can be obtained.

Whether or not a hole transport layer is provided in the first layer 211 or an electron transport layer is provided between the electron generation layer 215 and the second layer 212 may be appropriately selected by a practitioner. For example, these layers are not necessarily provided in the case or the like where inconvenience such as quenching due to metal is not occurred even when a hole transport layer or an electron transport layer is not provided.

A light emitting element shown in this embodiment can be formed by a known film formation method as well as a manufacturing method shown in Embodiment 1.

When depositing is conducted sequentially from the first electrode 201 and the second electrode 202 is deposited by sputtering, there is a problem of sputtering damage to a layer placed below the second electrode. However, the composite layer 214 is harder than an organic film; therefore, the composite layer is not easily damaged by sputtering and serves as a protective film which protects a light emitting layer from sputtering damage. Accordingly, a light emitting element with fewer defects can be obtained.

Embodiment 3

In this embodiment, a multilayer structure between a second layer 112 and a first electrode 101 shown in Embodiment 1 and a multilayer structure between a second layer 212 and a second electrode 202 shown in Embodiment 2 are combined.

In this case, a composite layer is arranged between a first electrode and a light emitting layer and between a second electrode and the light emitting layer; accordingly, a light emitting element having higher conductivity and having a high hole injecting property or a high hole transporting property can be provided. In other words, a light emitting element having an advantage of Embodiment 1 and an advantage of Embodiment 2 is obtained.

Figure 3A:
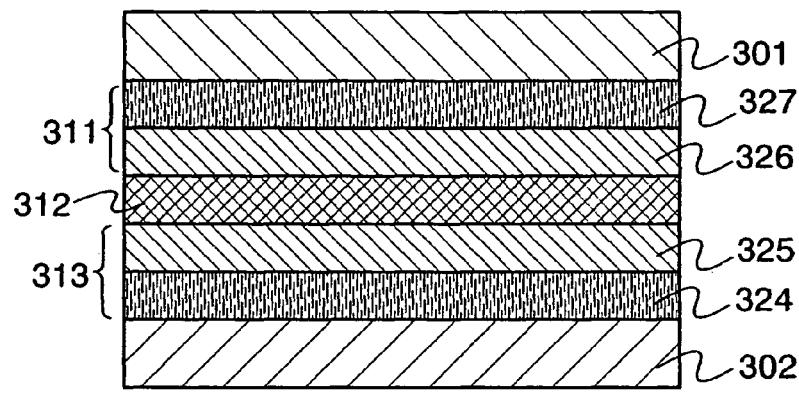
FIGS. 3A to 3C are views showing a light emitting element according to the invention.
Figure 3B:
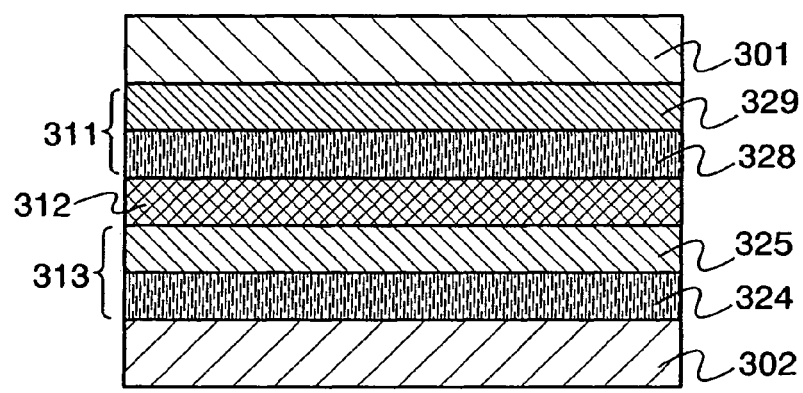
Figure 3C:
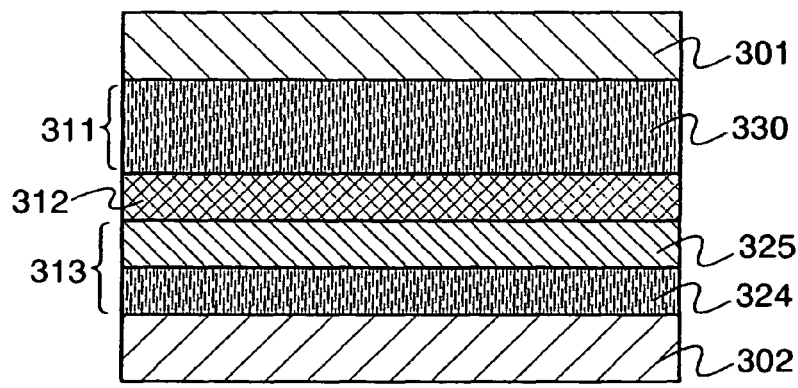

FIGS. 3A to 3C show a light emitting element which is one mode of this embodiment. In FIGS. 3A to 3C, a second layer 312 which is a light emitting layer is arranged between a first electrode 301 and a second electrode 302, which are a pair of electrode; a first layer 311, between the first electrode 301 and the second layer 312; and a third layer 313, between the second electrode 302 and the second layer 312. The third layer includes a first composite layer 324 which is at a second electrode 302 side and an electron generation layer 325 which is at a second layer 312 side. The element shown in FIGS. 3A to 3C is a light emitting element which emits light when voltage is applied to an electrode so that an electric potential of the first electrode 301 is higher than an electric potential of the second electrode 302.

FIG. 3A is a structure combining FIG. 1A and FIG. 2. A first layer 311 in FIG. 3A includes a hole transport layer 326 at a second layer 312 side and includes a composite layer 327 at a first electrode 301 side.

FIG. 3B shows a structure combining FIG. 1B and FIG. 2. A first layer 311 in FIG. 3B includes a second composite layer 328 at a second layer side and includes a hole injecting layer 329 at a first electrode 301 side.

FIG. 3C shows a structure combining FIG. 1C and FIG. 2. A first layer 311 in FIG. 3C is a second composite layer 330.

In this embodiment, a composite of a conjugated molecule and an electron-accepting substance, which is included in the first composite layer and the second composite layer, may be either the same or different. The light emitting element in this embodiment can be provided with the composite layer in both of the first layer 311 and the third layer 313; therefore, an element having high conductivity and high light extraction efficiency can be obtained. In addition, when a first electrode or a second electrode is formed by sputtering, there is a problem of sputtering damage to a layer placed in a lower layer. However, a composite layer is formed so as to be in contact with the first electrode and the second electrode in the structure shown in FIG. 3A or FIG. 3C; therefore, sputtering damage associated with the formation of the first electrode or the second electrode can be prevented.

Although an electron transport layer is not provided between the electron generation layer 325 and the second layer 312 in FIGS. 3A to 3C, whether the electron transport layer is provided or not may be appropriately selected by a practitioner.

Embodiment 4

A light emitting element of the present invention can be used for a pixel of a display device or a light source. In the case of using a light emitting element for a pixel, an image which has no operation failure and has favorable display color can be displayed. Further, a display device or a light emitting device having high reliability can be provided. Alternatively, in the case of using a light emitting element for a light source, a light emitting device having less inconvenience due to operation failure of a light emitting element and exhibiting bright light emission can be obtained.

In this embodiment, a light emitting device including a light emitting element of the invention in a pixel and having a display function is explained.

Figure 4:
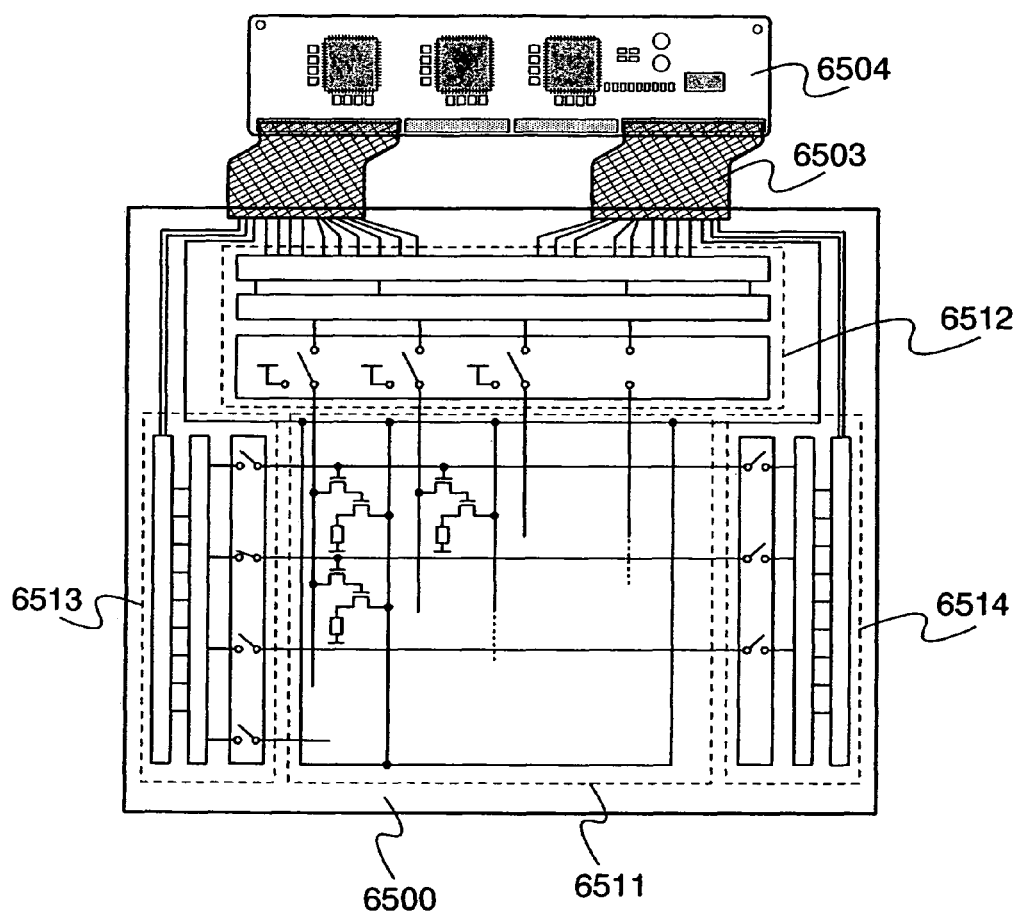
FIG. 4 is a view showing a top view of a light emitting device.

FIG. 4 is a schematic top view of the light emitting device. In FIG. 4, a pixel portion 6511 using a light emitting element of the invention, a source signal line driver circuit 6512, a writing gate signal line driver circuit 6513, and an erasing gate signal line driver circuit 6514 are provided over a substrate 6500. The source signal line driver circuit 6512, the writing gate signal line driver circuit 6513, and the erasing gate signal line driver circuit 6514 each are connected to an FPC (flexible printed circuit) 6503 which is an external input terminal, respectively, through a group of wirings. The source signal line driver circuit 6512, the writing gate signal line driver circuit 6513, and the erasing gate signal line driver circuit 6514 receive a video signal, a clock signal, a start signal, a reset signal, and the like, respectively, through the FPC 6503. A printed wiring board (PWB) 6504 is attached to the FPC 6503. A driver circuit portion is not required to be provided over the same substrate as the pixel portion 6511 as described above. For example, the driver circuit portion may be provided outside the substrate utilizing a TPC or the like which is formed by mounting an IC chip on an FPC provided with a wiring pattern.

In the pixel portion 6511, a plurality of source signal lines extended in a column direction is arranged in a row direction and current supply lines are arranged in the row direction. In the pixel portion 6511, a plurality of gate signal lines extended in the row direction is arranged in the column direction. Further, in the pixel portion 6511, a plurality of pixel circuits including the light emitting element shown in Embodiments 1 to 3 is arranged.

Figure 5:
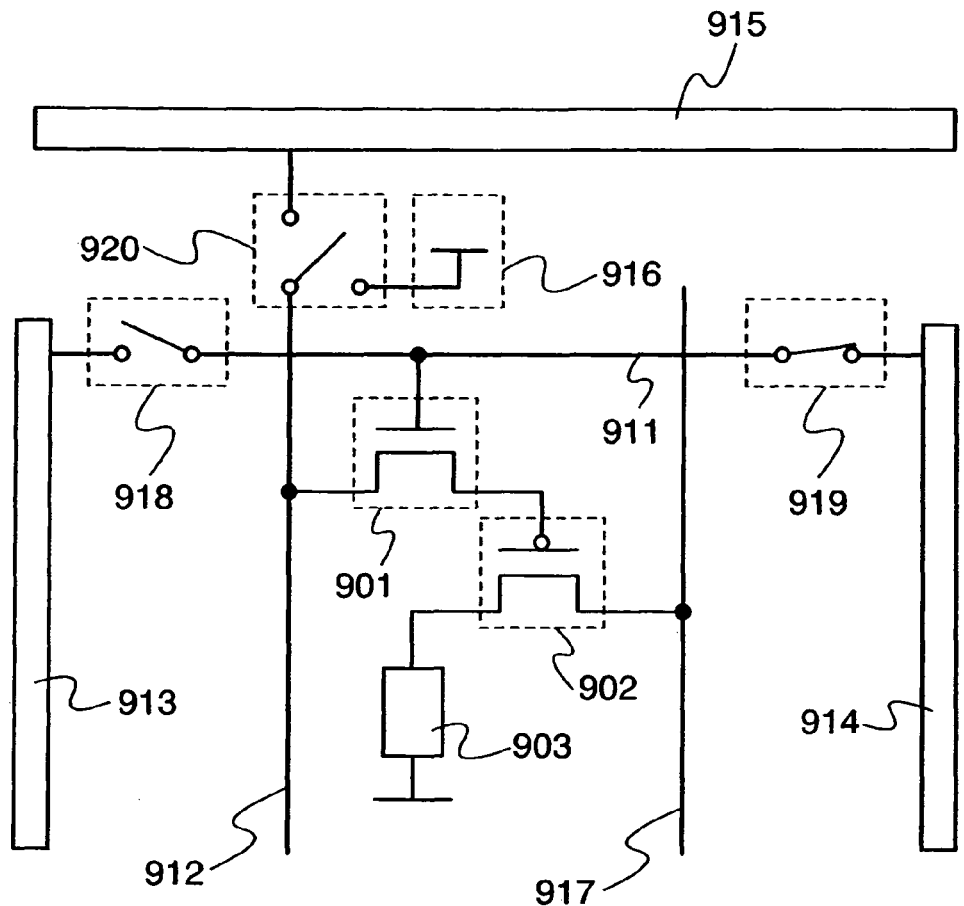
FIG. 5 is a diagram showing a circuit for making one pixel operate.

FIG. 5 is a diagram showing a circuit for making one pixel operate. A first transistor 901, a second transistor 902, and a light emitting element 903 of the invention are included in the circuit shown in FIG. 5.

The first transistor 901 and the second transistor 902 each have three terminals including a gate electrode, a drain region, and a source region and have a channel region between the drain region and the source region. Here, since the source region and the drain region are determined depending on the structure, the operation condition, or the like of the transistor, it is difficult to confine which is the source region or the drain region. Therefore, in this embodiment, regions which serve as a source or a drain are respectively referred to as a first electrode or a second electrode.

A gate signal line 911 and a writing gate signal line driver circuit 913 are provided so as to be electrically connected or disconnected to each other through a switch 918. The gate signal line 911 and an erasing gate signal line driver circuit 914 are provided so as to be electrically connected or disconnected to each other through a switch 919. A source signal line 912 is provided so as to be electrically connected to any of a source signal line driver circuit 915 and a power source 916 through a switch 920. A gate of the first transistor 901 is electrically connected to the gate signal line 911. A first electrode of the first transistor 901 is electrically connected to the source signal line 912 and a second electrode thereof is electrically connected to a gate electrode of the second transistor 902. A first electrode of the second transistor 902 is electrically connected to a current supply line 917, and a second electrode thereof is electrically connected to one electrode included in the light emitting element 903. Further, the switch 918 may be included in the writing gate signal line driver circuit 913. The switch 919 may be also included in the erasing gate signal line driver circuit 914. In addition, the switch 920 may be also included in the source signal line driver circuit 915.

Figure 6:
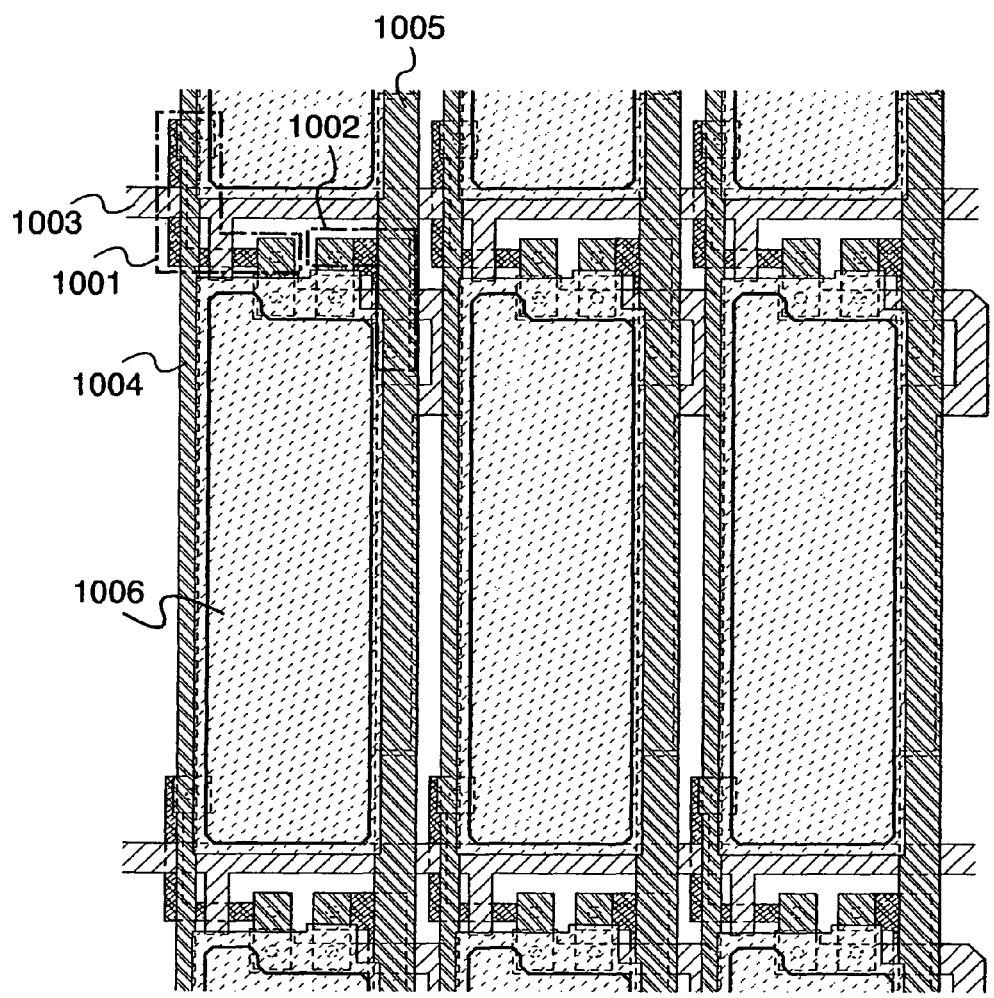
FIG. 6 is a top view of a pixel portion.

The arrangement of the transistor, the light emitting element, or the like in the pixel portion is not limited in particular; however, the transistor, the light emitting element, or the like can be arranged, for example, as shown in a top view of FIG. 6. In FIG. 6, a first electrode of a first transistor 1001 is connected to a source signal line 1004, and a second electrode thereof is connected to a gate electrode of a second transistor 1002. A first electrode of the second transistor 1002 is connected to a current supply line 1005, and a second electrode thereof is connected to an electrode 1006 of the light emitting element. A part of a gate signal line 1003 serves as a gate electrode of the first transistor 1001.

Embodiment 5

One mode of a light emitting device including a light emitting element of the present invention is explained with reference to FIGS. 7A to 7C and FIG. 8.

Figure 7A:
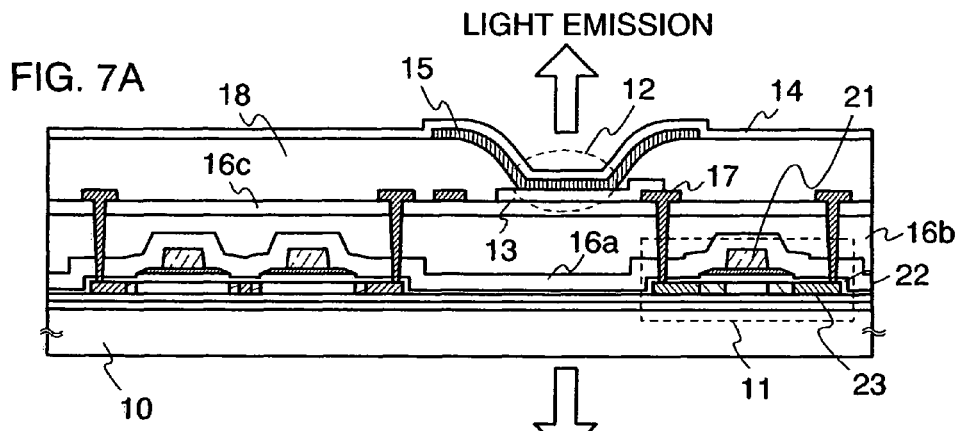
FIGS. 7A to 7C are views showing a light emitting element according to the invention.
Figure 7B:
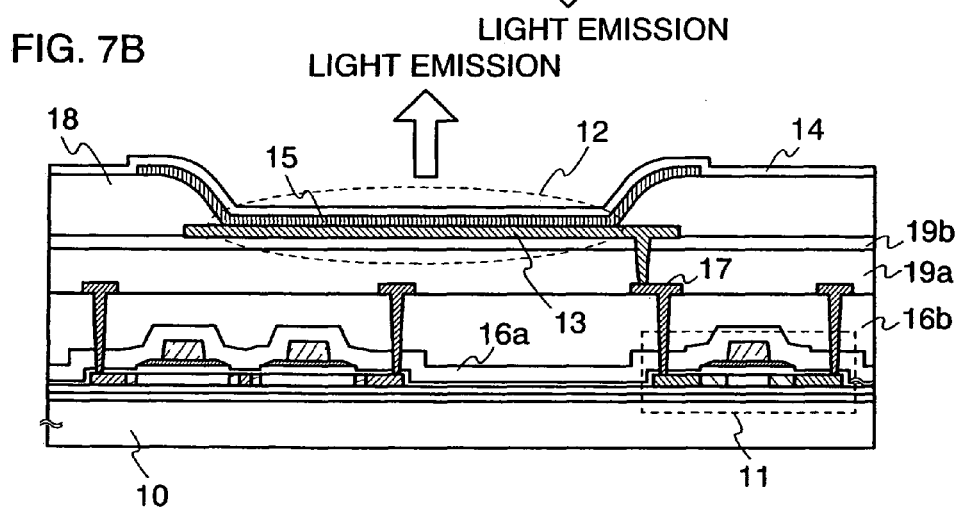
Figure 7C:
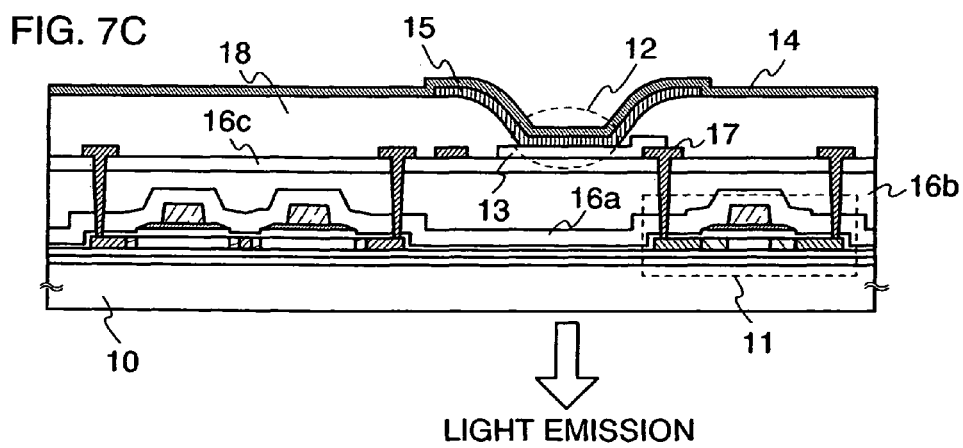

In each of FIGS. 7A to 7C, a transistor 11 is provided to drive a light emitting element 12 of the invention. The light emitting element 12 is a light emitting element of the invention having a layer 15 in which at least a composite layer and a layer containing a light emitting substance are stacked between a first electrode 13 and a second electrode 14. A drain of the transistor 11 is electrically connected to the first electrode 13 through a wiring 17 which penetrates first interlayer insulating films 16a, 16b, and 16c. The light emitting element 12 is separated from another light emitting element which is provided adjacent to the light emitting element 12 by a partition layer 18. A light emitting device of the invention having such a structure is provided over a substrate 10 in this embodiment.

The transistor 11 shown in each of FIGS. 7A to 7C is a top gate type transistor in which a gate electrode is provided to the side opposite to the substrate so as to interpose a semiconductor layer between the gate electrode and the substrate. However, the structure of the transistor 11 is not limited in particular, and for example, bottom gate type transistor may be used. In case of a bottom gate type transistor, a transistor in which a protective film is formed over a semiconductor layer which is to form a channel (channel protection type transistor) or a transistor in which a part of a semiconductor layer which is to form a channel has a depression shape (channel etch type transistor) may be used. Reference numeral 21 denotes a gate electrode; 22, a gate insulating film; and 23, a semiconductor layer.

A semiconductor layer included in the transistor 11 may be any of a crystalline semiconductor, an amorphous semiconductor, a semi-amorphous semiconductor, and the like.

A semi-amorphous semiconductor is described as follows. A semi-amorphous semiconductor has an intermediate structure between an amorphous structure and a crystalline structure (including a single crystalline and polycrystalline structure), a third state which is stable in terms of free energy, and a crystalline region having a short-range order and lattice distortion. In addition, at least a part of the film includes a crystal grain having a grain diameter of from 0.5 nm to 20 nm. The Raman spectrum shifts to the lower wavenumber side than 520 cm$^{-1}$. Diffraction peaks of (111) and (220) which is thought to be derived from Si crystalline lattice are observed by X-ray diffraction. At least 1 atomic % or more of hydrogen or halogen is contained in the semi-amorphous semiconductor in order to terminate a dangling bond. The semi-amorphous semiconductor is also referred to as a so-called microcrystal semiconductor. It is formed by glow discharge decomposition (plasma CVD) of a silicon source gas. $SiH_4$, additionally, $Si_2H_6$, $SiH_2Cl_2$, $SiHCl_3$, $SiCl_4$, $SiF_4$, or the like can be used as the silicon source gas. The silicon source gas may be diluted with $H_2$, or $H_2$ and one or more kinds of rare gas elements selected from He, Ar, Kr, or Ne. Dilution ratio is in the range of from 2 times to 1000 times. Pressure is in the range of approximately from 0.1 Pa to 133 Pa, and power frequency is from 1 MHz to 120 MHz, preferably, from 13 MHz to 60 MHz. The temperature for heating a substrate may be 300° C. or less, preferably, in the range of from 100° C. to 250° C. As for an impurity element in the film, impurities of atmospheric component such as oxygen, nitrogen, or carbon are preferably set to be $1 \times 10^{20}$ cm$^3$ or less, in particular, the oxygen concentration is set to be $5 \times 10^{19}$/cm$^3$ or less, preferably, $1 \times 10^{19}$/cm$^3$ or less. Further, mobility of a TFT (thin film transistor) using a semi-amorphous semiconductor is approximately from 1 m$^2$/Vsec to 10 m$^2$/Vsec.

As a specific example of a crystalline semiconductor layer, a semiconductor layer formed from single crystal silicon, polycrystalline silicon, silicon germanium, or the like can be cited. These materials may be formed by laser crystallization. For example, these materials may be formed by crystallization with use of a solid phase growth method using nickel or the like.

When a semiconductor layer is formed from an amorphous material, for example amorphous silicon, it is preferable to use a light emitting device with circuits including only n-channel transistors as the transistor 11 and another transistor (transistor included in a circuit for driving a light emitting element). Alternatively, a light emitting device with circuits including any one of n-channel transistors and p-channel transistors may be employed. Also, a light emitting device with circuits including both an n-channel transistor and a p-channel transistor may be used.

The first interlayer insulating films 16a to 16c may include plural layers as shown in FIGS. 7A to 7C or a single layer. The first interlayer insulating film 16a is formed from an inorganic material such as silicon oxide and silicon nitride. The first interlayer insulating film 16b is formed from acrylic, siloxane (siloxane is composed of a skeleton formed by the bond of silicon (Si) and oxygen (O), in which an organic group containing at least hydrogen (such as alkyl group or aromatic hydrocarbon) is included as a substituent. Alternatively, a fluoro group may be used as the substituent. Further alternatively, a fluoro group and an organic group containing at least hydrogen may be used as the substituent.), or a substance with a self-planarizing property that can be formed by applying a liquid such as silicon oxide. The first interlayer insulating film 16c is formed of a silicon nitride film containing argon (Ar). The substances constituting each of the layers are not particularly limited thereto, and substances other than the above-mentioned substances may be employed. Alternatively, a layer formed from substance other than the above-mentioned substances may be further combined. Accordingly, the first interlayer insulating film may be formed from both an inorganic material and an organic material or formed of any one of an inorganic film and an organic film.

The edge portion of the partition layer 18 preferably has a shape in which the radius of curvature is continuously varied. The partition layer 18 is formed from acrylic, siloxane, resist, silicon oxide, or the like. Further, the partition layer 18 may be formed of any one of or both an inorganic film and an organic film.

FIGS. 7A and 7C show the structures in which only the first interlayer insulating film 16 (16c to 16c) is interposed between the transistors 11 and the light emitting elements 12. Alternatively, FIG. 7B shows the structure provided with the first interlayer insulating film 16 (16a and 16b) and a second interlayer insulting film 19 (19a and 19b). In the light emitting device shown in FIG. 7B, the first electrode 13 penetrates the second interlayer insulating films 19 (19a and 19b) to be connected to the wiring 17.

The second interlayer insulating film 19 (19a and 19b) may include plural layers or a single layer as well as the first interlayer insulating film 16 (16a to 16c). The second interlayer insulating film 19a is formed from acrylic, siloxane, or a substance with a self-planarizing property that can be formed by applying a liquid such as silicon oxide. The second interlayer insulating film 19b is formed from a silicon nitride film containing argon (Ar). The substances included in each of the second interlayer insulating layers are not particularly limited thereto, and substances other than the above-mentioned substances may be employed. Alternatively, a layer formed from a substance other than the above-mentioned substances may be further combined. Accordingly, the second interlayer insulating film 19 (19a and 19b) may be formed from both an inorganic material and an organic material or formed of any one of inorganic and organic films.

When the first electrode and the second electrode are both formed from a substance with a light transmitting property in the light emitting element 12, light can be emitted from both a first electrode 13 side and a second electrode 14 side as shown in outline arrows in FIG. 7A. When only the second electrode 14 is formed from a substance with a light transmitting property, light can be emitted only from a second electrode 14 side as shown in an outline arrow in FIG. 7B. In this case, the first electrode 13 is preferably formed from a material with high reflectance or a film (reflection film) formed from a material with high reflectance is preferably provided below the first electrode 13. When only the first electrode 13 is formed from a substance with a light transmitting property, light can be emitted only from a first electrode 13 side as shown in an outline arrow in FIG. 7C. In this case, the second electrode 14 is preferably formed from a material with high reflectance or a reflection film is preferably provided above the second electrode 14.

Moreover, the light emitting element 12 may have a structure in which the layer 15 is stacked so that the light emitting element operates when voltage is applied so that an electric potential of the second electrode 14 is higher than an electric potential of the first electrode 13. Alternatively, the light emitting element 12 may have a structure in which the layer 15 is stacked so that the light emitting element operates when voltage is applied so that an electric potential of the second electrode 14 is lower than an electric potential of the first electrode 13. In the former case, the transistor 11 is an n-channel transistor. In the latter case, the transistor 11 is a p-channel transistor.

As described above, although an active type light emitting device which controls driving of a light emitting element by a transistor is explained in this embodiment, a passive type light emitting device which controls driving of a light emitting element without providing an element for driving, such as a transistor, in particular may be used.

Figure 8:
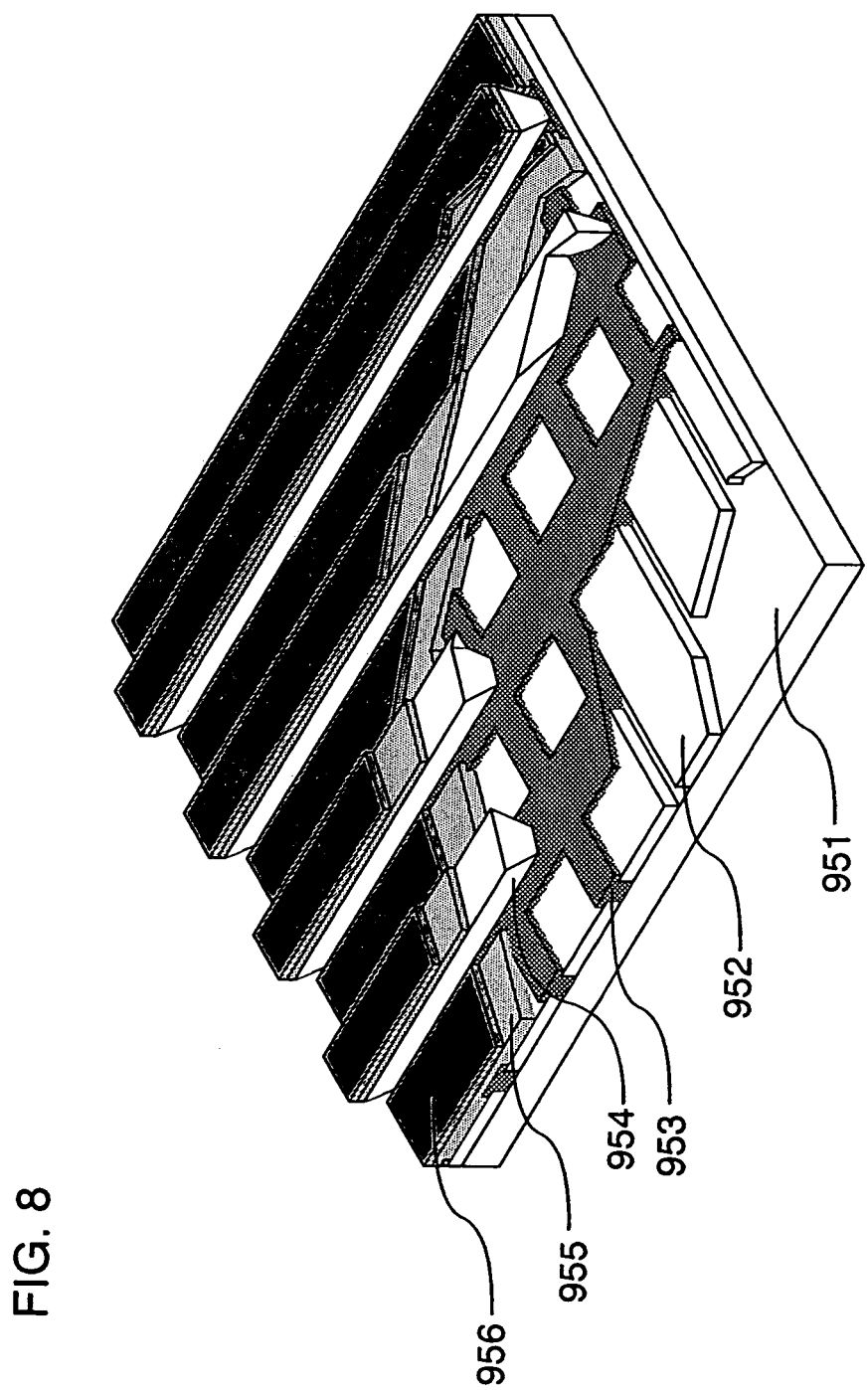
FIG. 8 is a view showing a passive type light emitting device according to the invention.

FIG. 8 shows a perspective view of a passive type light emitting device manufactured by applying the invention. In FIG. 8, a layer 955 including at least a layer containing a light emitting substance and a composite layer is provided between an electrode 952 and an electrode 956 which are intersect with each other over a substrate 951. The edge portion of the electrode 952 is covered with an insulating layer 953. A partition layer 954 is provided over the insulating layer 953. The cross section of the partition layer 954 in a direction of a short side has an inverted trapezoidal shape in which a base is shorter than an upper side. Thus, failure of a light emitting element due to static electricity or the like can be prevented by providing the partition layer 954. In addition, also in a passive type light emitting device, driving at low power consumption can be conducted by including a light emitting element of the invention which operates at low drive voltage.

Embodiment 6

As for a light emitting device using the light emitting element of the invention as a pixel, there is fewer display defects due to operation failure of the light emitting element; therefore, display operation is favorable. Further, an electronic apparatus with less misconception or the like of a display image due to display defect can be obtained. In addition, a light emitting device using the light emitting element of the invention as a light source can illuminate favorably with less inconvenience due to operation failure of the light emitting element. By using such a light emitting device as an illuminating portion such as a backlight, operation failure such as the local formation of a dark portion due to inconvenience of the light emitting element is reduced.

Figure 9A:
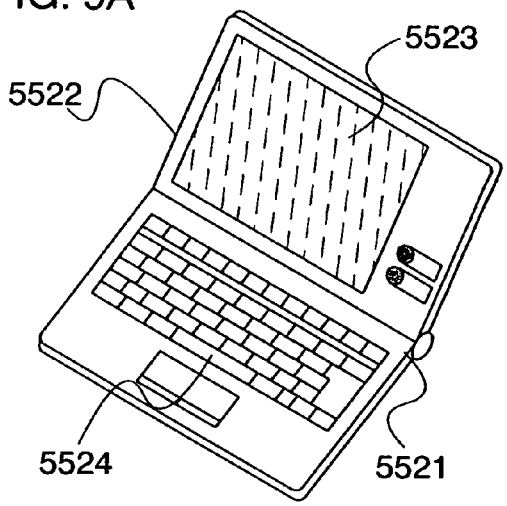
FIGS. 9A to 9C are views showing an electronic device according to the invention.
Figure 9B:
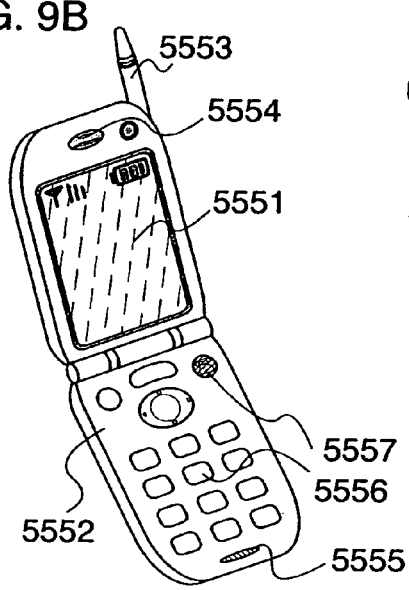
Figure 9C:
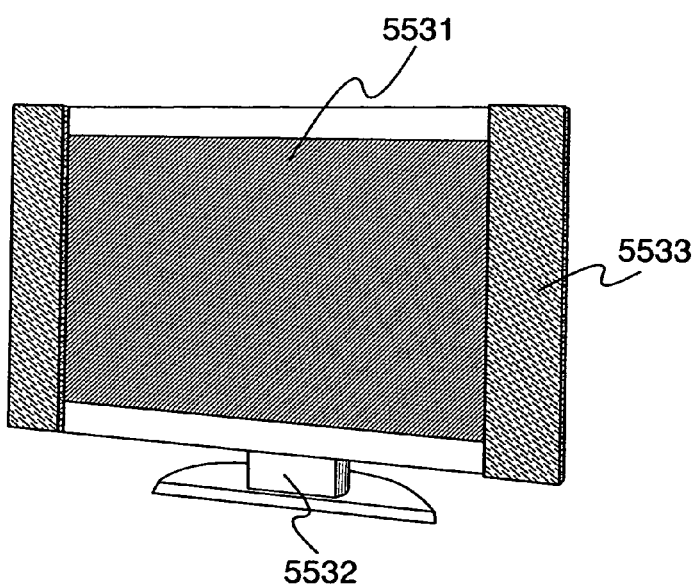

FIGS. 9A to 9C show one example of an electronic device mounted with a light emitting device to which the invention is applied.

Figure 10:
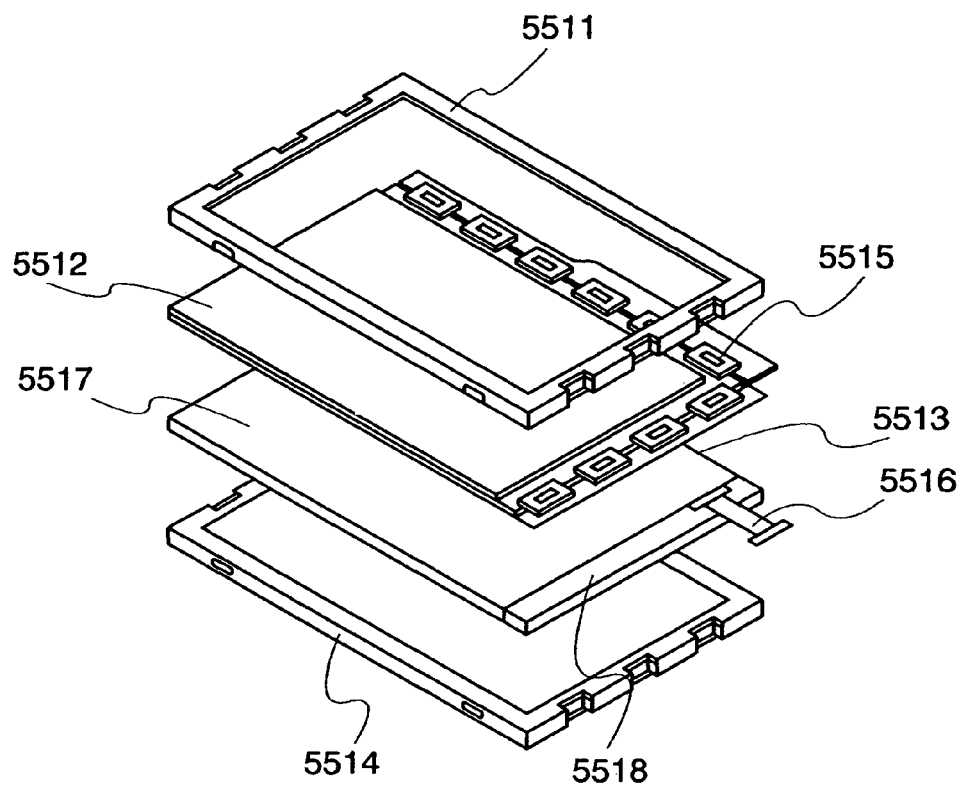
FIG. 10 is a view showing an electronic device in which a light emitting element according to the invention is incorporated into a backlight.

FIG. 9A is a personal computer manufactured by applying the invention, which includes a main body 5521, a chassis 5522, a display portion 5523, a keyboard 5524, and the like. A personal computer can be completed by incorporating a light emitting device shown in FIGS. 7A to 7C as a display portion. A personal computer can be also completed even when a light emitting device in which a light emitting element according to the invention is used as a light source is incorporated as a backlight. Specifically, as shown in FIG. 10, a liquid crystal device 5512 and a light emitting device 5513 as a light source may be incorporated between a chassis 5511 and a chassis 5514. The light emitting device 5513 includes an array 5518 composed of a light emitting element according to the invention and a light conducting plate 5517. In FIG. 10, an external input terminal 5515 is mounted on the liquid crystal device 5512 and an external input terminal 5516 is mounted on the array 5518.

FIG. 9B is a telephone set manufactured by applying the invention, and a main body 5552 includes a display portion 5551, an audio output portion 5554, an audio input portion 5555, an operation switch 5556, an operation switch 5557, an antenna 5553, and the like. A telephone set can be completed by incorporating a light emitting device of the invention as a display portion.

FIG. 9C is a television receiver manufactured by applying the invention, which includes a display portion 5531, a chassis 5532, a speaker 5533, and the like. A television receiver can be completed by incorporating a light emitting device of the invention as a display portion.

As described above, light emitting devices according to the invention are much suitable for being used as display portions of various electronic devices. An electronic device is not limited to the electronic device described in this embodiment, and may be another electronic device such as a navigation system.

Embodiment 7

In this embodiment, a composite used as a material of a light emitting element of the present invention is described. The composite is an object in which any of conjugated molecules shown in general formulas [1] to [5] which will be described below with a substance having an electron-accepting property to the conjugated molecule.

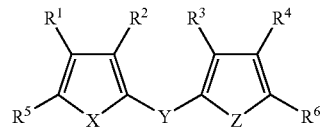

[1]

wherein X is the same as or different from Z, and X and Z each represent any of a sulfur atom, an oxygen atom, a nitrogen atom to which hydrogen, an alkyl group, or an aryl group is bonded, and a silicon atom to which hydrogen, alkyl group, or an aryl group is bonded; Y represents an arylene group; and $R^1$ to $R^6$ each represent any of hydrogen, an aryl group, an alkyl group, a cyano group, a dialkylamino group, a thioalkoxy group, and an alkoxy group.

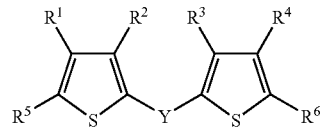

[2]

wherein Y represents an arylene group, and $R^1$ to $R^6$ each represent any of hydrogen, an aryl group, an alkyl group, a cyano group, a dialkylamino group, a thioalkoxy group, and an alkoxy group.

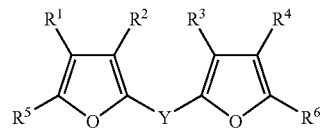

[3]

wherein Y represents an arylene group, and $R^1$ to $R^6$ each represent any of hydrogen, an aryl group, an alkyl group, a cyano group, a dialkylamino group, a thioalkoxy group, and an alkoxy group.

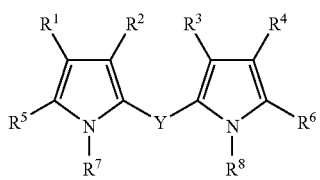

[4]

wherein Y represents an arylene group; $R^1$ to $R^6$ each represent any of hydrogen, an aryl group, an alkyl group, a cyano group, a dialkylamino group, a thioalkoxy group, and an alkoxy group; and $R^7$ and $R^8$ each represent any of hydrogen, an alkyl group, and an aryl group.

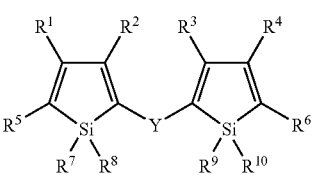

[5]

wherein Y represents an arylene group; $R^1$ to $R^6$ each represent any of hydrogen, an aryl group, an alkyl group, a cyano group, a dialkylamino group, a thioalkoxy group, and an alkoxy group; and $R^7$ to $R^{10}$ each represent any of hydrogen, an alkyl group, and an aryl group.

As for the conjugated molecules shown in general formulas [1] to [5] described above, in the formula, Y represents an arylene group and represents a bivalent aromatic hydrocarbon radical having a carbon number of 6 to 20 or a bivalent heteroaromatic ring radical having a carbon number of 4 to 30 including oxygen, nitrogen, sulfur, or silicon.

These conjugated molecules have extremely low ionization potential; therefore, an electron is transferred inside a composite by forming an electron-accepting substance and a composite. Therefore, a composite layer formed of a composite has a feature that a hole is easy to generate or a hole is easy to move. In addition, due to such a feature, the composite layer has a feature of having high conductivity. Therefore, the composite layer is a layer in which a hole flows more favorable since the composite layer has an electron-accepting substance when a layer including a material having low ionization potential is compared with the composite layer.

Metal oxide or metal nitride is preferably used for the electron-accepting substance. In particular, oxide having a transition metal which belongs to any of Groups 4 to 12 in the periodic table has a high electron-accepting property. In addition, there are many oxides each having a transition metal which belongs to any of Groups 4 to 8 in the periodic table having a further higher electron-accepting property. In particular, vanadium oxide, molybdenum oxide, rhenium oxide, tungsten oxide, ruthenium oxide, titanium oxide, chromium oxide, zirconium oxide, hafnium oxide, tantalum oxide, or niobium oxide is preferable.

Further, an organic compound having an electron-accepting property may be used as the electron-accepting substance. Specifically, 7,7,8,8-tetracyano-2,3,5,6-tetrafluoroquinodimethan (F4-TCNQ), chloranil, and the like are given. Further, Lewis acid may be used as the electron-accepting substance. As an example of Lewis acid, $FeCl_3$ (iron chloride (III)) and $AlCl_3$ (aluminum chloride) are given.

The most suitable mixture ratio of the electron-accepting substance in the composite layer to any of the conjugated molecules represented by general formulas [1] to [5] is as follows: electron-accepting substance/conjugated molecule=0.1 to 10, preferably 0.5 to 2, at a molar ratio. At this mixture ratio, an electron is efficiently transferred between the electron-accepting substance and the conjugated molecule and the highest conductivity of the composite layer is obtained.

EXAMPLE 1

In this example, as a representative of a compound represented by a general formula [2], 1,4-di(3,4-ethylenedioxy-2-thienyl)benzene which is a compound represented by the following formula [6] and 4,4'-di(3,4-ethylenedioxy-2-thienyl) biphenyl which is a compound represented by the following formula [7] each were synthesized.

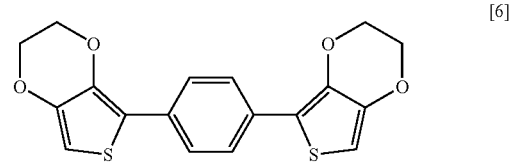

[6]

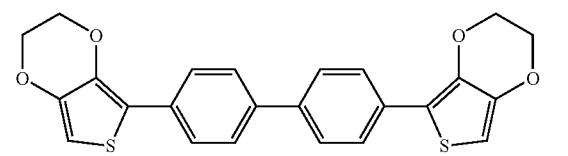

[7]

The compounds represented by formulas [6] and [7] have extremely low ionization potential. In other words, it is revealed that an effective conjugate length of the whole molecules is expanded by forming a cyclic structure by $R^1$ and $R^2$ and forming a cyclic structure by $R^3$ and $R^4$ in the compounds represented by the general formulas [1] to [5].

Figure 11:
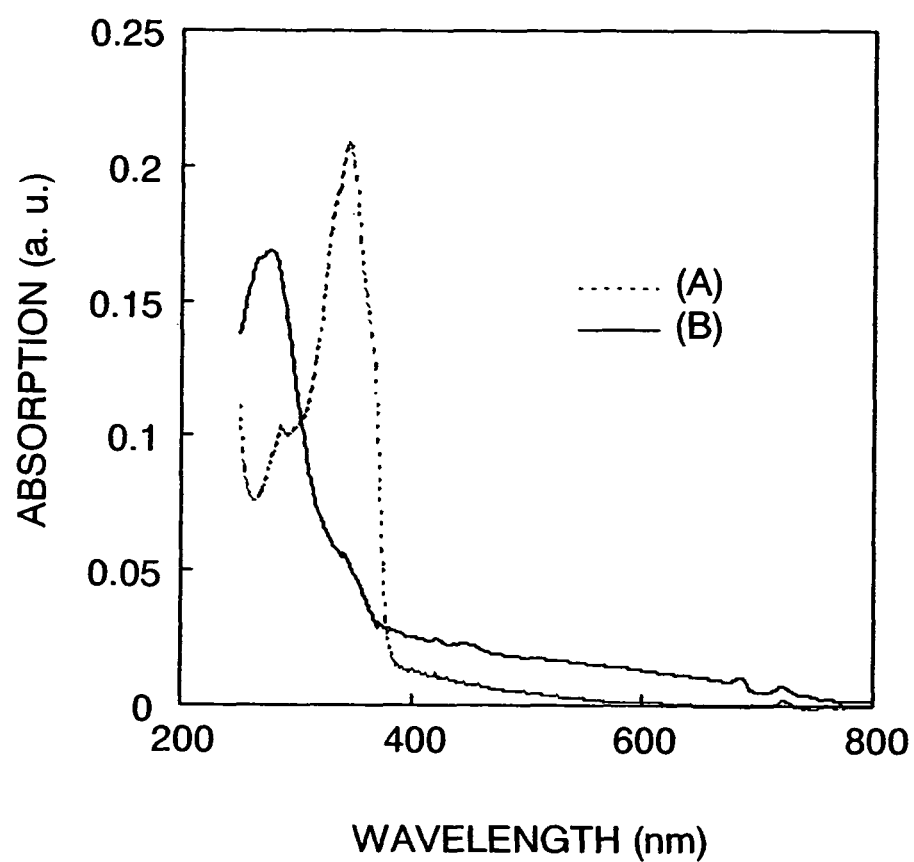
FIG. 11 is a view showing ultraviolet-visible spectrum of a conjugated molecule.

FIG. 11 shows ultraviolet-visible absorption spectrum of 1,4-di(3,4-ethylenedioxy-2-thienyl)benzene (formula [6]) and its analogue, 1,4-bis(3,4-dihexyloxy-2-thienyl)benzene. Formula [8] shows a structure of 1,4-bis(3,4-dihexyloxy-2-thienyl)benzene. An absorption maximum of the former compound is at 380 nm as shown in (A) in FIG. 11, while an absorption maximum of the latter compound is at 300 nm as shown in (B) in FIG. 11, thereby revealing that the formula [6] which has the cyclic structure has a conjugated system which is expanded more. As shown in (A) in FIG. 11, absorption intensity in the visible light region of the formula [6] is remarkably low, and this is prominently different from a conventional hole injection material.

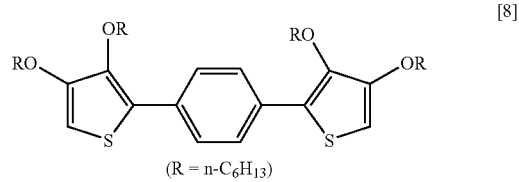

[8]

$(R = n\text{-}C_6H_{13})$

Further, a cyclic voltammetry measurement is conducted by the formulas [6] and [8]. From the measurement thereof, it is revealed that the formula [6] has a conjugated system which is expanded more. The cyclic voltammetry measurement is conducted by using acetonitrile as a solvent and tetrabutyl ammonium perchlorate as a supporting electrolyte. Each of a working electrode and a counter electrode is formed from platinum. Silver/silver chloride is used for a reference electrode.

Accordingly, oxidation potential of the formula [8] is 1.68 V, while oxidation potential of the formula [6] is 1.20 V (vs. Ag/Ag$^+$), thereby revealing that the formula [8] is less subject to oxidation.

To sum up, an effective conjugate length of the whole molecules is expanded by forming a cyclic structure by $R^1$ and $R^2$ and forming a cyclic structure by $R^3$ and $R^4$ in the conjugated molecules represented by the general formulas [1] to [5]. When an effective conjugate length is expanded, a band gap is shortened and ionization potential is lowered. Therefore, an electron-donating property of a conjugated molecule is more heightened. Accordingly, a composite layer having higher conductivity, in which a hole is generated more easily, is obtained by forming a composite layer from a conjugated molecule in which an effective conjugate length is expanded, and an electron-accepting substance.

Example 2

In this example, the synthesis of 1,4-di(3,4-ethylenedioxy-5-trimethylsilyl-2-thienyl)benzene represented by the following formula [9] as a representative of a compound represented by a general formula [2] is described.

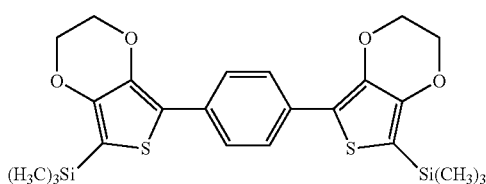

[9]

FIGS. 12A to 12D show the synthesis scheme. A hexane solution (48 ml, 74.9 mmol) of 1.56N n-butyllithium is dropped into a dry THF solution (100 mL) of 3,4-ethylenedioxythiophene (compound in FIG. 12A; 10.30 g, 72.5 mmol) at −78° C. After completion of the dropping, the solution is stirred for one hour at −78° C. Chlorotrimethylsilane (8.93 g, 82.3 mmol) is dropped into the solution and a temperature of the reacted solution is gradually raised to a room temperature. After stirring for three hours, the reacted mixture is concentrated under reduced pressure, followed by extraction with hexane. A hexane layer is dried with magnesium sulfate, followed by filtering. The filtered object is concentrated, and then a residue is distilled under reduced pressure (200 Pa, 94° C. to 100° C.), thereby giving 2-trimethylsilyl-3,4-ethylenedioxythiophene which is a compound represented by FIG. 12B. Yield: 84%.

The $^1$H NMR spectrum of the product is obtained and the result is as follows:

$^1$H NMR (300 MHz, CDCl$_3$) δ 0.286 (s, 9H), 4.16 (s, 2H), 4.17 (s, 2H), 6.54 (s, 1H): $^{13}$C NMR (75 MHz, CDCl$_3$) δ −0.74, 64.42, 64.51, 104.68, 111.28, 142.63, 147.25.

Figures 12A, 12B, 12C:
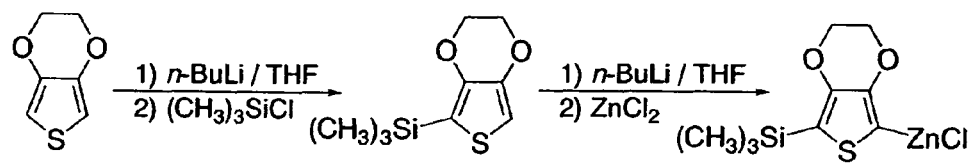
FIGS. 12A to 12D are views of a synthesis scheme.

A hexane solution (55 mL, 86.0 mmol) of 1.56N n-butyllithium is dropped into a dry THF solution (150 mL) of the compound represented by FIG. 12B, 2-trimethylsilyl-3,4-ethylenedioxythiophene (18.6 g, 86.0 mmol), at −78° C. After completion of the dropping, the mixture is stirred for one hour at −78° C. and for 30 minutes at 0° C. This solution is dropped into a dry THF suspension (100 mL) of zinc chloride (11.69 g, 85.8 mmol) at a room temperature. After stirring for one hour, a compound represented by FIG. 12C is obtained in the system. After that, 1,4-diburomobenzene (6.759 g, 28.7 mmol) and tetrakis(triphenylphosphine)palladium (0) (1.28 g, 1.11 mmol) are added, followed by heat-reflux for ten hours. The reacted mixture is thrown into water of approximately 1 L, and then precipitates are filtered. The filtered object is dried and then purified by silica gel column chromatography (developer: hexane/ethyl acetate 10/1 to 2/1), followed by recrystallization with hexane/ethyl acetate (5/1), thereby giving 1,4-di(3,4-ethylenedioxy-5-trimethylsilyl-2-thienyl)benzene which is a compound represented by FIG. 12D. Yield: 43%.

The $^1$H NMR spectrum of the product is obtained and the result is as follows:

$^1$H NMR (300 MHz, CDCl$_3$) δ 0.311 (s, 18H), 4.27 (s, 4H), 4.29 (s, 4H), 7.69 (s, 4H).

Figure 12D:
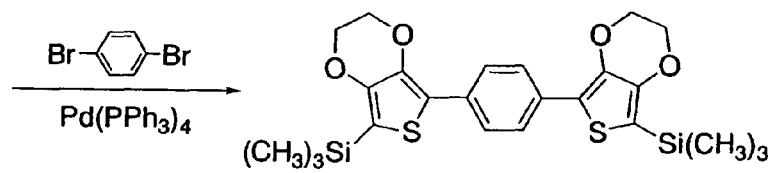
Figure 13:
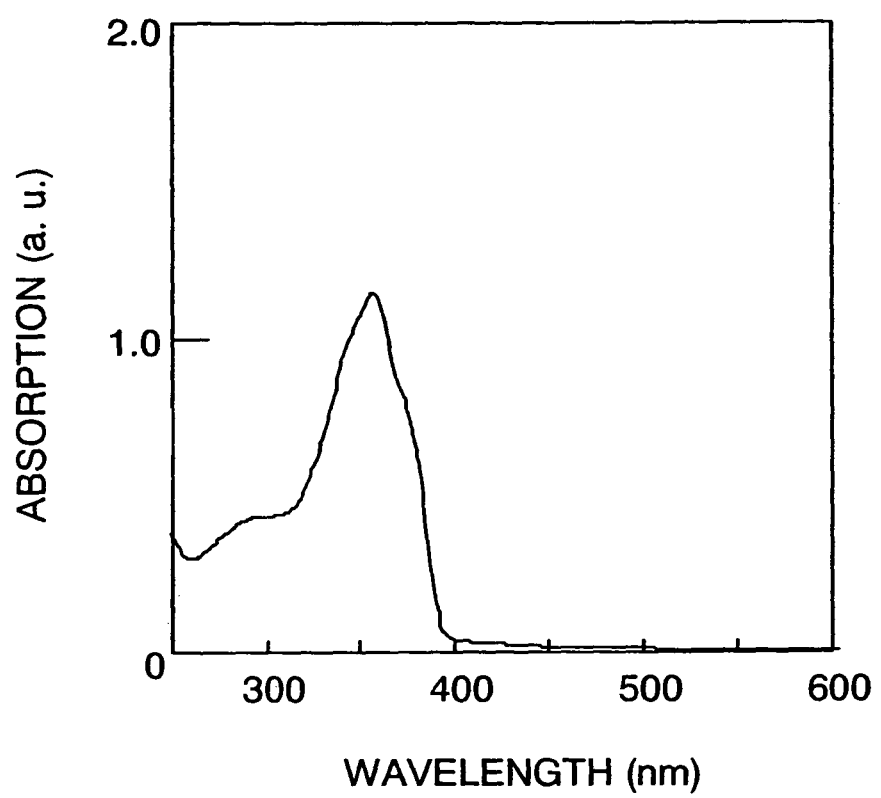
FIG. 13 is a view showing ultraviolet-visible spectrum ($2.55 \times 10^{-5}$M in methylene chloride) of a conjugated molecule.
Figure 14:
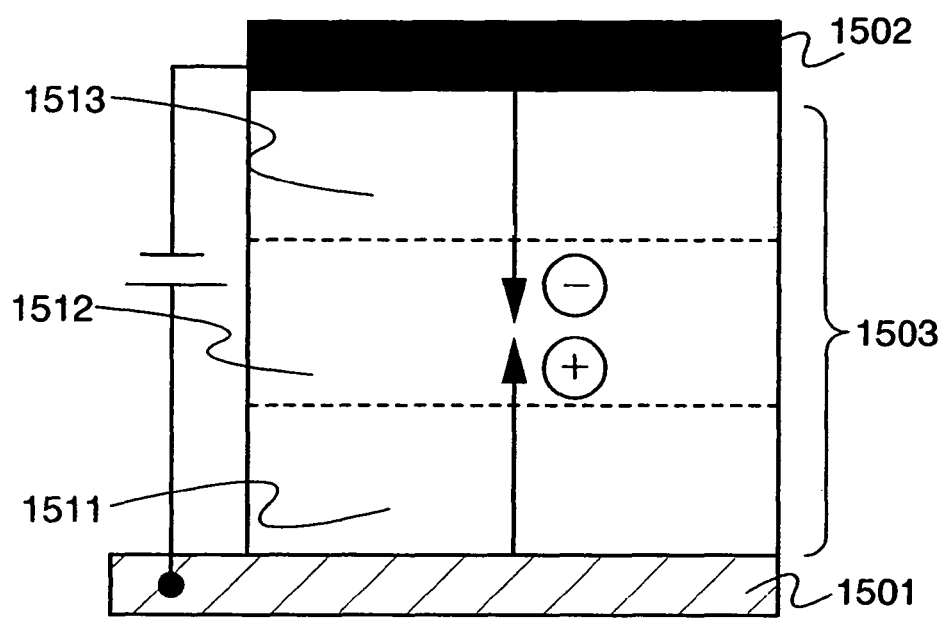
FIG. 14 is a view showing a conventional example.

FIG. 13 shows an ultraviolet-visible absorption spectrum of the thus-synthesized compound represented by FIG. 12D. As shown in FIG. 13, the absorption in a visible light region is remarkably small, and, thanks to the small absorption, it is possible to largely reduce the coloring of the element.

Example 3

In this example, an effect of introducing a substituent other than hydrogen into $R^5$ and $R^6$ in the compounds represented by general formulas [1] to [5] is described. Solubility is remarkably low when $R^5$ and $R^6$ are hydrogen atoms. For instance, solubility to chloroform of the compound represented by the formula [6] described in Example 1 is less than 1 wt % at 25° C. In contrast, in the case where $R^5$ and $R^6$ represented by FIG. 12D are trimethylsilyl groups, the solubility to chloroform at 25° C. is 15.4 wt %. Thus, it is possible to considerably improve the solubility by introducing the substituent other than hydrogen into $R^5$ and $R^6$.

Further, solubility is low when hydrogen is introduced into $R^5$ and $R^6$; however, when a substituent other than hydrogen is introduced, a deposited film having favorable film quality is obtained in a reflection of high solubility.

Example 4

In this example, the synthesis of 4,4'-bis(5-phenyl-3,4-ethylenedioxy-2-thienyl) biphenyl (hereinafter, referred to as DPEBP) represented by the following formula [10] as a representative of a compound represented by a general formula [2] is described.

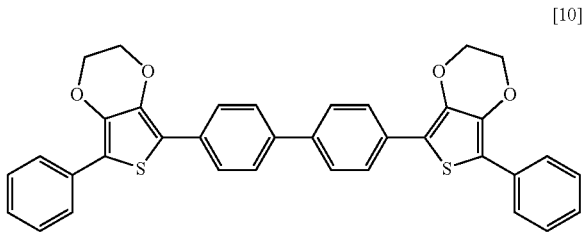

[10]

First, the synthesis of the following formula [11] which is an intermediate (hereinafter, referred to as "intermediate a") is described. A dry THF solution of 250 ml is added into 2,3-dihydrothieno-[3,4-b]-1,4-dioxin of 22.41 g, followed by cooling to −78° C. Then, n-butyllithium (hexane solution of 1.58M) of 100 ml is dropped, followed by stir for one hour. The obtained mixture is added into zinc chloride of 25.84 g at a room temperature, and then further stirred at a room temperature for one hour. Bromobenzene of 18.3 ml and tetrakis (triphenylphosphine)palladium of 1.83 g are added into this mixture, and then stirred for five hours under heat-reflux. Ethyl acetate, hydrochloric acid of 1M, and water are added into the solution cooled up to a room temperature, followed by fractionation of an organic layer. After drying by magnesium sulfate, the solvent is concentrated. Then, purification is conducted by column chromatography (hexane/ethyl acetate).

The $^1$H NMR spectrum of the product is obtained and the result is as follows:

$^1$H NMR (CDCl$_3$, δ) 7.72 ppm (d, 2H), 7.36 ppm (t, 2H), 7.21 ppm (t, 1H), 6.29 ppm (s, 1H), 4.29 ppm (m, 4H).

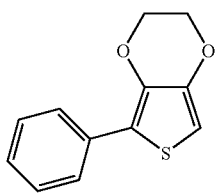

[11]

Next, a THF of 100 ml is added into the obtained intermediate a of 10.36 g, followed by cooling to −78° C. Then, n-butyllithium (hexane solution of 1.58M) of 33.1 ml is dropped, followed by stir for one hour. The obtained mixture is added into zinc chloride of 7.77 g at a room temperature, and further stirred at a room temperature for one hour. 4,4'-diiodo biphenyl of 8.77 g and tetrakis(triphenylphosphine) palladium of 549 mg are added into the mixture, and then stirred for five hours under heat-reflux. A solid obtained by filtering this mixture is washed with ethanol. Recrystallization is conducted using chloroform, followed by obtaining an organic compound DPEBP (yellow powder) of the present invention.

The $^1$H NMR spectrum of the product is obtained and the result is as follows:

$^1$H NMR (CDCl$_3$, δ) 7.77 ppm (m, 12H), 7.44 ppm (t, 4H), 7.28 ppm (t, 2H), 4.45 ppm (s, 8H).

Example 5

In this example, the synthesis of 1,4-bis(5-phenyl-3,4-ethylenedioxy-2-thienyl)benzene (hereinafter, referred to as DPEBZ) represented by the following formula [12] as a representative of a compound represented by a general formula [2] is described.

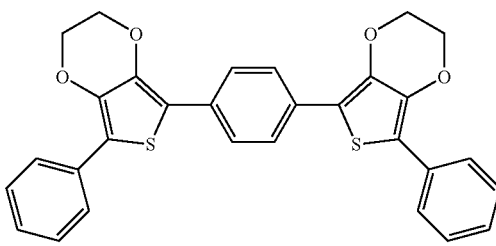

[12]

A THF of 100 ml is added into the intermediate a 6.07 g obtained in Example 4, followed by cooling to −78° C. Then, n-butyllithium (hexane solution of 1.58M) of 19.4 ml is dropped, followed by stir for one hour. The obtained mixture is added into zinc chloride of 4.50 g at a room temperature, and then further stirred at a room temperature for one hour. 1,4-diiodo benzene of 4.12 g and tetrakis(triphenylphosphine)palladium of 321 mg are added into the mixture, and then stirred for five hours under heat-reflux. The solid obtained by filtering this mixture is washed with ethanol. Recrystallization is conducted using chloroform, followed by obtaining an organic compound DPEBZ (orange powder) of the present invention.

The $^1$H NMR spectrum of the product is obtained and the result is as follows:

$^1$H NMR (CDCl$_3$, δ) 7.77 ppm (m, 8H), 7.38 ppm (t, 4H), 7.23 ppm (t, 2H), 4.38 ppm (s, 8H).

Example 6

In this example, the synthesis of 4,4'-bis[5-(4-tert-buthylphenyl)-3,4-ethylenedioxy-2-thienyl) biphenyl (hereinafter, referred to as DtBuPEBP) represented by the following formula [13] as a representative of a compound represented by a general formula [2] is described.

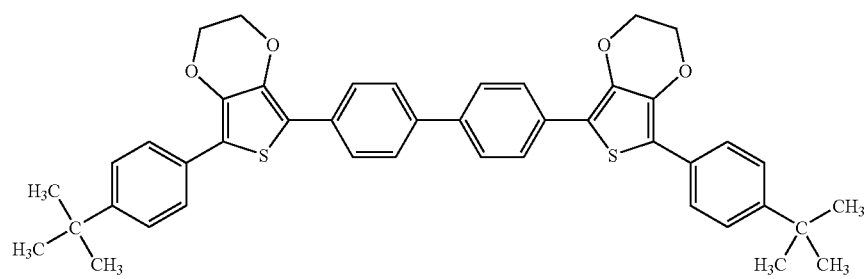

[13]

First, the synthesis of the following formula [14] which is an intermediate (hereinafter, referred to as "intermediate b") is described. A THF of 100 ml is added into 2,3-dihydrothieno-[3,4-b]-1,4-dioxin of 10.57 g, followed by cooling to −78° C. A LDA (2.0M) of 37.2 ml is dropped, followed by further stirred for one hour. Zinc chloride of 12.14 g is added, and then stirred at a room temperature for one hour. 1-bromo-4-tert-butylbenzene of 14.3 ml and tetrakis(triphenylphosphine)palladium of 859 mg are added into this mixture, followed by stirred under heat-reflux for eight hours. Ethyl acetate and water are added into the solution cooled at a room temperature, followed by fractionation of an organic layer. After drying by magnesium sulfate, the solvent is concentrated. Then, purification is conducted by column chromatography (toluene).

The $^1$H NMR spectrum of the product is obtained and the result is as follows:

$^1$H NMR (CDCl$_3$, δ) 7.67 ppm (d, 2H), 7.45 ppm (d, 2H), 6.32 ppm (s, 1H), 1.40 ppm (s, 9H).

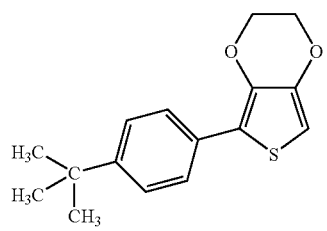

[14]

A THF of 50 ml is added into the intermediate b of 2.56 g obtained above, followed by cooling to −78° C. A LDA (2.0M) of 5.12 ml is dropped, followed by stir for one hour. Zinc chloride of 1.53 g is added, and stirred at a room temperature for one hour. 4,4'-diiodo biphenyl of 1.71 g and tetrakis(triphenylphosphine)palladium of 107 mg were added, and then stirred for six hours under heat-reflux. Ethyl acetate, hydrochloric acid of 1M, and water are added into the solution cooled to a room temperature, followed by fractionation of an organic layer. After drying by magnesium sulfate, the solvent is concentrated. Recrystallization is conducted using chloroform, followed by obtaining an organic compound DtBuPEBP of the present invention.

The $^1$H NMR spectrum of the product is obtained and the result is as follows:

$^1$H NMR (CDCl$_3$, δ) 7.80 ppm (d, 4H), 7.66 ppm (m, 8H), 7.41 ppm (d, 4H), 4.36 ppm (s, 8H), 1.32 ppm (s, 9H).

This application is based on Japanese Patent Application serial No. 2004-347693 field in Japan Patent Office on Nov. 30, 2004, the entire contents of which are hereby incorporated by reference.

EXPLANATION OF REFERENCES

101: first electrode, 102: second electrode, 111: first layer, 112: second layer, 113: third layer, 114: composite layer, 115: hole transport layer, 116: composite layer, 117: hole injecting layer, 118: composite layer, 201: first electrode, 202: second electrode, 211: first layer, 212: second layer, 213: third layer, 214: composite layer, 215: electron generation layer, 301: first electrode, 302: second electrode, 311: first layer, 312: second layer, 313: third layer, 324: first composite layer, 325: electron generation layer, 326: hole transport layer, 327: second composite layer, 328: second composite layer, 329: hole injecting layer, 330: second composite layer, 6500: substrate, 6503: FPC, 6504: printed wiring board (PWB), 6511: pixel portion, 6512: source signal line driver circuit, 6513: writing gate signal line driver circuit, 6514: erasing gate signal line driver circuit, 901: first transistor, 902: second transistor, 903: light emitting element, 911: gate signal line, 912: source signal line, 913: writing gate signal line driver circuit, 914: erasing gate signal line driver circuit, 915: source signal line driver circuit, 916: power supply, 917: current supply line, 918: switch, 919: switch, 920: switch, 1001: first transistor, 1002: second transistor, 1003: gate signal line, 1004: source signal line, 1005: current supply line, 1006: electrode, 10: substrate, 11: transistor, 12: light emitting element, 13: first electrode, 14: second electrode, 15: layer, 16a: first interlayer insulating film, 16b: first interlayer insulating film, 16c: first interlayer insulating film, 17: wiring, 18: partition layer, 19a: second interlayer insulating film, 19b: second interlayer insulating film, 21: gate electrode, 22: gate insulating film, 23: semiconductor layer, 951: substrate, 952: electrode, 953: insulating layer, 954: partition layer, 955: layer, 956: electrode, 5521: main body, 5522: chassis, 5523 display portion, 5524: keyboard, 5551: display portion, 5552: main body, 5553: antenna, 5554: audio output portion, 5555: audio input portion, 5556: operation switch, 5557: operation switch, 5531: display portion, 5532: chassis, 5533: speaker, 5511: chassis, 5512: liquid crystal device, 5513: light emitting device, 5514: chassis, 5515: external input terminal, 5516: external input terminal, 5517: light conducting plate, 5518: array, 1501: first electrode, 1502: second electrode, 1503: layer, 1511: hole transport layer, 1512: light emitting layer, 1513: electron transport layer

The invention claimed is:

1. A light emitting element comprising:
   a pair of electrodes including a first electrode and a second electrode;
   a hole injecting layer in contact with the first electrode;
   a first layer in contact with the hole injecting layer, wherein an ionization potential of the hole injecting layer is larger than an ionization potential of the first layer;
   a light emitting layer in contact with the first layer; and
   an electron generation layer in contact with the light emitting layer and with the first layer,
   wherein the first layer contains a composite of a conjugated molecule represented by a following general formula [1] and an oxide of a transition metal which belongs to any one of Groups 4 to 8 in the periodic table,

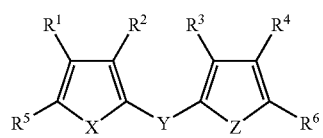

[1]

wherein the X is different from the Z,
   wherein the X and the Z each represent a sulfur atom, an oxygen atom, a nitrogen atom to which hydrogen, an alkyl group, or aryl group is bonded, or a silicon atom to which hydrogen, alkyl group, or aryl group is bonded,
   wherein the Y represents an arylene group, and
   wherein the R$^1$ to R$^4$ each represent a hydrogen atom, and the R$^5$ and R$^6$ each represent an aryl group.

2. A light emitting element according to claim 1, wherein the light emitting element emits light from the light emitting layer when a voltage is applied so that an electric potential of the first electrode is higher than that of the second electrode.

3. A light emitting element according to claim 1, wherein the oxide of the transition metal which belongs to any one of Groups 4 to 8 in the periodic table includes vanadium oxide, molybdenum oxide, rhenium oxide, tungsten oxide, ruthenium oxide, titanium oxide, chromium oxide, zirconium oxide, hafnium oxide, tantalum oxide, or niobium oxide.

4. A light emitting element according to claim 1, wherein the Y in the formula of the conjugated molecule contains a bivalent aromatic hydrocarbon radical having a carbon number of 6 to 20, or a bivalent heteroaromatic ring radical having a carbon number of 4 to 30 including oxygen, nitrogen, sulfur or silicon.

5. A light emitting element according to claim 1, wherein the light emitting element is used as a pixel of an electronic apparatus.

6. A light emitting element according to claim 5, wherein the electronic apparatus is at least one selected from the group consisting of a personal computer, a telephone, and a television.

7. A light emitting element according to claim 1, wherein the light emitting element is used as a light source.

8. A light emitting element according to claim 1, further comprising an electron generation layer in contact with the light emitting layer.

9. A light emitting element according to claim 1, wherein the hole injecting layer contains a phthalocyanine-based compound.

* * * * *